United States Patent
Saito et al.

(10) Patent No.: US 8,680,608 B2
(45) Date of Patent: Mar. 25, 2014

(54) POWER SEMICONDUCTOR DEVICE WITH A LOW ON RESISTENCE

(75) Inventors: Wataru Saito, Kanagawa-ken (JP);
Syotaro Ono, Kanagawa-ken (JP);
Munehisa Yabuzaki, Hyogo-ken (JP);
Nana Hatano, Kanagawa-ken (JP);
Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/862,490

(22) Filed: Aug. 24, 2010

(65) Prior Publication Data

US 2011/0049615 A1    Mar. 3, 2011

(30) Foreign Application Priority Data

Aug. 25, 2009  (JP) ................. 2009-194841

(51) Int. Cl.
*H01L 29/78*    (2006.01)

(52) U.S. Cl.
USPC .... 257/329; 257/339; 257/341; 257/E29.021; 257/E29.257; 257/E29.262

(58) Field of Classification Search
USPC .......... 257/329, 339, E29.256, E29.262, 341, 257/E29.021, E29.257
See application file for complete search history.

(56) References Cited

U.S. PATENT DOCUMENTS

| | | | |
|---|---|---|---|
| 6,103,578 A | | 8/2000 | Uenishi et al. |
| 6,410,958 B1 * | | 6/2002 | Usui et al. .................. 257/329 |
| 6,693,338 B2 | | 2/2004 | Saitoh et al. |
| 6,740,931 B2 * | | 5/2004 | Okumura et al. ............. 257/341 |
| 6,750,508 B2 | | 6/2004 | Omura et al. |
| 6,888,195 B2 | | 5/2005 | Saito et al. |
| 6,919,610 B2 * | | 7/2005 | Saitoh et al. .................. 257/492 |
| 7,238,576 B2 * | | 7/2007 | Yamaguchi et al. .......... 438/268 |
| 7,259,426 B2 * | | 8/2007 | Aida et al. .................... 257/341 |
| 7,294,886 B2 * | | 11/2007 | Saito et al. .................... 257/341 |

(Continued)

FOREIGN PATENT DOCUMENTS

| | | |
|---|---|---|
| CN | 1356729 | 7/2002 |
| CN | 1812129 | 8/2006 |

(Continued)

OTHER PUBLICATIONS

Moens, P., et al., Stress-Induced Mobility Enhancement for Integrated Power Transistors, IEEE, Dec. 2007, pp. 877-880.

(Continued)

*Primary Examiner* — John C Ingham
(74) *Attorney, Agent, or Firm* — Patterson & Sheridan, LLP

(57) ABSTRACT

According to one embodiment, a power semiconductor device includes a second semiconductor layer of a first conductivity type and a third semiconductor layer of a second conductivity type periodically disposed repeatedly along a surface of the first semiconductor layer on a first semiconductor layer of the first conductivity type. A first main electrode is provided to electrically connect to the first semiconductor layer. A fourth semiconductor layer of the second conductivity type is provided to connect to the third semiconductor layer. Fifth semiconductor layers of the first conductivity type are selectively provided in the fourth semiconductor layer surface. A second main electrode is provided on a surface of the fourth and fifth semiconductor layers. A control electrode is provided on a surface of the fourth, fifth, and second semiconductor layers via a gate insulating film. First insulating films are provided by filling a trench made in the second semiconductor layer.

20 Claims, 18 Drawing Sheets

(56) References Cited

U.S. PATENT DOCUMENTS

| | | | |
|---|---|---|---|
| 7,301,202 B2 * | 11/2007 | Kouzuki et al. | 257/335 |
| 7,482,210 B2 * | 1/2009 | Kim et al. | 438/151 |
| 7,544,570 B2 * | 6/2009 | Ohtani | 438/268 |
| 8,022,474 B2 * | 9/2011 | Haeberlen et al. | 257/331 |
| 2004/0094819 A1 | 5/2004 | Saitoh et al. | |

FOREIGN PATENT DOCUMENTS

| | | |
|---|---|---|
| JP | 2002-164540 | 6/2002 |
| JP | 2006-186145 | 7/2006 |
| JP | 2009-105219 | 5/2009 |

OTHER PUBLICATIONS

Japanese Office Action dated Dec. 27, 2011, filed in Japanese counterpart Application No. 2009-194841, 6 pages (with English translation).

Chinese Office Action dated May 23, 2012, filed in Chinese counterpart Application No. 201010263767.5, 19 pages (with English translation).

Chinese Office Action dated Feb. 7, 2013, filed in Chinese counterpart Application No. 201010263767.5, 18 pages (with translation).

* cited by examiner

POWER SEMICONDUCTOR DEVICE WITH A LOW ON RESISTENCE

CROSS-REFERENCE TO RELATED APPLICATIONS

This application is based upon and claims the benefit of priority from the prior Japanese Patent Application No. 2009-194841, filed on Aug. 25, 2009; the entire contents of which are incorporated herein by reference.

FIELD

Embodiments described herein relate generally to a power semiconductor device.

BACKGROUND

The ON resistance of a vertical power MOSFET (Metal Oxide Semiconductor Field Effect Transistor) strongly depends on the electrical resistance of the conductive layer (the drift layer) portion. The doping concentration that determines the electrical resistance of the drift layer cannot exceed a limitation according to the breakdown voltage of the pn junction formed by the base layer and the drift layer. Therefore, a trade-off relationship exists between the device breakdown voltage and the ON resistance. It is important to improve such a trade-off relationship in low power-consumption devices. Some limitations of the trade-off relationship are determined by the device materials; and overcoming such limitations may lead to the realization of low ON-resistance devices superior to conventional power devices.

One known example of a MOSFET improves the trade-off relationship by providing a structure called a super junction structure made of p-type pillar layers and n-type pillar layers in the drift layer. The super junction structure realizes a low ON resistance superior to that of material limitations by providing current through a highly-doped n-type pillar layer while maintaining a high breakdown voltage by artificially making a non-doped layer by equalizing the charge amount (the impurity amount) between the p-type pillar layer and the n-type pillar layer.

Although it is possible to improve the trade-off relationship between the ON resistance and device breakdown voltage to overcome the material limitations by using such a super junction structure, it is necessary to use a narrow lateral period of the super junction structure to increase the impurity amounts of the p-type pillar layer and the n-type pillar layer and reduce the ON resistance. In the case where the impurity amounts of the p-type pillar layer and the n-type pillar layer are increased without using a narrow lateral period, the lateral electric field increases due to full depletion of the super junction structure; and the vertical electric field that determines the breakdown voltage undesirably decreases. Therefore, the breakdown voltage undesirably decreases with the ON resistance.

The narrow lateral period of the super junction structure is indispensable to reduce the ON resistance while maintaining the high breakdown voltage. However, processes to reduce the lateral period of the super junction structure unfortunately become complex. Even if the lateral period can be made narrow, increasing the impurity amount causes a breakdown voltage decrease to occur easily due to fluctuation of the impurity amount. To solve such problems, for example, a power semiconductor device has been disclosed in which the impurity concentration of the p-type pillar layer is reduced deeper in the vertical direction.

Although the discussed power semiconductor device having a sloping profile increases the manufacturing process margin regarding the fluctuation of the impurity amount, difficulties remain for controlling the impurity amount because it is necessary to form an impurity concentration distribution having a slope in the vertical direction.

In a power transistor in which a channel MOS and a drift capacitor are stacked perpendicularly in a trench, it has been discussed that stress is induced in silicon (an n-type epitaxial layer) by a silicon oxide film of the trench capacitor; and higher mobility in the stress-induced silicon and a lower resistance have been observed.

BRIEF DESCRIPTION OF THE DRAWINGS

FIG. 1A is a cross-sectional view of a vertical direction and FIG. 1B is a cross-sectional view of a planar direction passing through an A-A position in FIG. 1A;

FIG. 3A is a cross-sectional view of the vertical direction passing through a B-B position, FIG. 3B is a cross-sectional view of the planar direction passing through the A-A position in FIG. 3A and the positional relationship between the A-A position and the B-B position is similar in following figures;

FIG. 4A is a cross-sectional view of the vertical direction and FIG. 4B is a cross-sectional view of the planar direction;

FIG. 5A is a cross-sectional view of the vertical direction and FIG. 5B is a cross-sectional view of the planar direction;

FIG. 6A is a cross-sectional view of the vertical direction and FIG. 6B is a cross-sectional view of the planar direction;

FIG. 7A is a cross-sectional view of the vertical direction and FIG. 7B is a cross-sectional view of the planar direction;

FIG. 8A is a cross-sectional view of the vertical direction and FIG. 8B is a cross-sectional view of the planar direction;

FIG. 9A is a cross-sectional view of the vertical direction and FIG. 9B is a cross-sectional view of the planar direction;

FIG. 10A is a cross-sectional view of the vertical direction and FIG. 10B is a cross-sectional view of the planar direction;

FIG. 11A is a cross-sectional view of the vertical direction and FIG. 11B is a cross-sectional view of the planar direction;

FIG. 12A is a cross-sectional view of the vertical direction and FIG. 12B is a cross-sectional view of the planar direction;

FIG. 13A is a cross-sectional view of the vertical direction and FIG. 13B is a cross-sectional view of the planar direction;

FIG. 14A is a cross-sectional view of the vertical direction and FIG. 14B is a cross-sectional view of the planar direction;

DETAILED DESCRIPTION

Figure 1A:
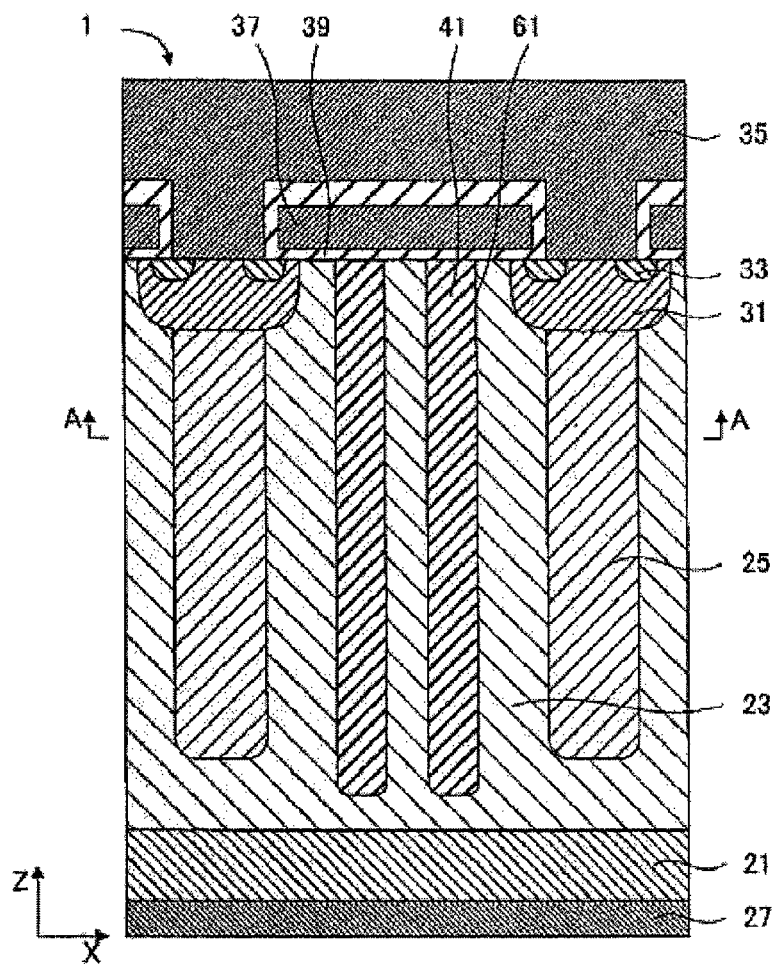
FIGS. 1A and 1B are views schematically illustrating a power semiconductor device according to a first embodiment of the invention.

In general, according to one embodiment, a power semiconductor device includes a first semiconductor layer of a first conductivity type, a second semiconductor layer, a third semiconductor layer, a first main electrode, a fourth semiconductor layer, fifth semiconductor layers, a second main electrode, a control electrode and a plurality of first insulating films. The second semiconductor layer of the first conductivity type and the third semiconductor layer of a second conductivity type are provided on the first semiconductor layer of the first conductivity type and periodically disposed repeatedly in a first direction along a surface of the first semiconductor layer. The first main electrode is electrically connected to the first semiconductor layer. The fourth semiconductor layer of the second conductivity type is provided to connect to the third semiconductor layer. The fifth semiconductor layers of the first conductivity type are selectively provided in the fourth semiconductor layer surface. The second main electrode is provided on a surface of the fourth semiconductor layer and the fifth semiconductor layers. The control electrode is provided on a surface of the fourth semiconductor layer, the fifth semiconductor layers, and the second semiconductor layer via a gate insulating film. The plurality of first insulating films are provided by filling a trench made in the second semiconductor layer.

Exemplary embodiments of the invention will now be described with reference to the drawings. Similar components in the drawings hereinbelow are marked with like reference numerals. In the description hereinbelow, the top face side of a vertical power semiconductor device on which a gate electrode, a source electrode, and the like are disposed is taken as upward.

First Embodiment

A power semiconductor device according to the first embodiment of the invention will now be described with reference to FIGS. 1A and 1B.

Figure 1B:
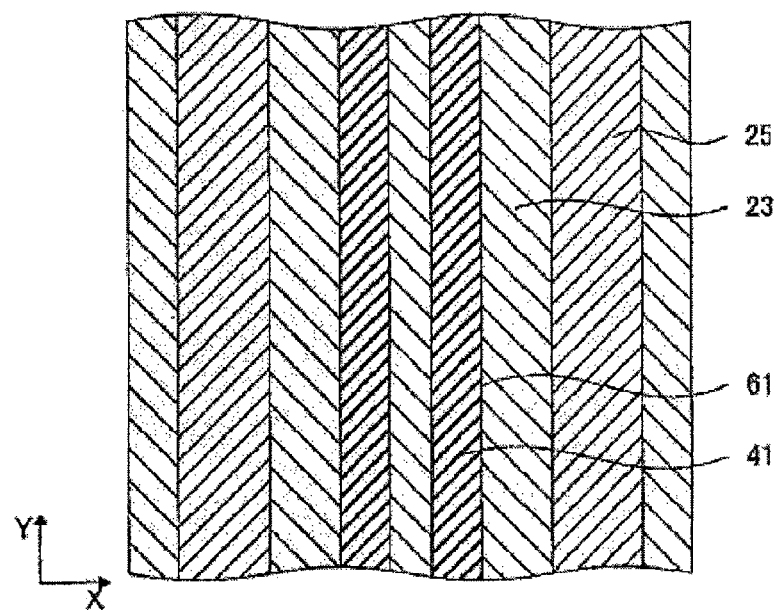

As illustrated in FIGS. 1A and 1B, the power semiconductor device 1 includes: an $n^+$-type drain layer 21 made of silicon (Si), i.e., a first semiconductor layer of a first conductivity type; an n-type pillar layer 23, i.e., a second semiconductor layer, and a p-type pillar layer 25, i.e., a third semiconductor layer of a second conductivity type, where the n-type pillar layer 23 and the p-type pillar layer 25 are provided on the $n^+$-type drain layer 21 to form a super junction (hereinbelow also referred to as SJ) structure by periodically repeating in one direction on a plane, i.e., the left/right page surface direction (also referred to as the X-direction and the lateral direction); a drain electrode 27, i.e., a first main electrode, electrically connected to the $n^+$-type drain layer 21; a p-type base layer 31, i.e., a fourth semiconductor layer, provided to connect to the p-type pillar layer 25; an n-type source layer 33, i.e., a fifth semiconductor layer selectively provided in the p-type base layer 31 surface; a source electrode 35, i.e., a second main electrode, provided on the surface of the p-type base layer 31 and the n-type source layer 33; a gate electrode 37, i.e., a control electrode, provided on the surface of the p-type base layer 31, the n-type source layer 33, and the n-type pillar layer 23 via a gate insulating film 39; and mutually opposing insulating films 41, i.e., first and second insulating films, having trench configurations apart from each other and parallel to each other in the n-type pillar layer 23 and parallel to the p-type pillar layer 25.

In the power semiconductor device 1, the impurity concentration and the X-direction width of each of the n-type pillar layer 23 and the p-type pillar layer 25 are set such that full depletion of the n-type pillar layer 23 and the p-type pillar layer 25 is possible, that is, such that the impurity amounts thereof are equal.

The gate insulating film 39 is, for example, a silicon oxide film. The gate insulating film 39 also may be a silicon oxynitride film, etc.

The insulating film 41 is formed, for example, by filling a trench 61 made in the n-type pillar layer 23 with a silicon oxide film by thermal oxidation. The trench 61 may be completely filled by the thermal oxidation.

As illustrated in FIG. 1B, the insulating films 41 are arranged apart from each other parallel to the up/down page surface direction (the Y-direction) in which the n-type pillar layer 23 and the p-type pillar layer 25 are extended. The width of the n-type pillar layer 23 between the two rows of the mutually opposing insulating films 41 is, for example, about 1 μm or less. Each of the mutually opposing insulating films 41 has the same distance to the p-type pillar layer 25 on either side of the n-type pillar layer 23.

The upper faces of the insulating films 41 contact the gate insulating film 39. The lower faces of the insulating films 41 are positioned apart from the $n^+$-type drain layer 21, are positioned at the same height, and are positioned more proximally to the $n^+$-type drain layer 21 than is the lower face of the p-type pillar layer 25.

The silicon oxide film forming the insulating film 41 contacting the trench 61 side wall in the silicon forming the n-type pillar layer 23 will now be described. By forming the silicon oxide film (the insulating film 41) on the surface of the silicon (the trench 61 side wall), a tensile stress occurs in the direction along the surface of the insulating film 41. It is well-known that such stress increases the mobility of electrons; and a low ON resistance can be realized by reducing the resistance of the n-type pillar layer 23 proximal to the trench 61 side wall.

Although the mobility increases as the volume of the silicon oxide film (the insulating film 41) increases due to the increase of the stress, in the case where the cross-sectional area of the n-type pillar layer 23 is too small compared to the increase of the mobility, the resistance of the n-type pillar layer 23 undesirably increases. Therefore, as illustrated in FIGS. 1A and 1B, it is possible to increase the mobility while ensuring the cross-sectional area of the n-type pillar layer 23 by increasing the stress applied to the n-type pillar layer 23 by forming two rows of narrow insulating films 41 and providing a narrow spacing between the insulating films 41.

By providing spacing between the mutually opposing insulating films 41 of, for example, not more than 1 μm, stress on the order of 100 MPa can be applied; and the electron mobility can be increased about 20%. In the case where the cross-sectional area of the insulating film 41 is not more than 10% of that of the n-type pillar layer 23, it is possible to reduce the ON resistance 10% or more without increasing the impurity concentration of the n-type pillar layer 23. In other words, in the power semiconductor device 1, it is possible to reduce the ON resistance without reducing the breakdown voltage and without reducing the X-direction period, i.e., the width, by disposing the insulating films 41 in the n-type pillar layer 23. In addition, by forming insulating films in the n-type pillar layer 23, stress can be applied to a whole of the n-type pillar layer 23. Therefore, it is possible to reduce the ON resistance.

The structure illustrated in the invention also provides the effect of increasing the saturation drain current. In the case where a drain voltage is applied in the ON state, a depletion layer extends from the p-type pillar layer 25 to the n-type pillar layer 23. The drain current saturates by the full depletion of the n-type pillar layer 23. The n-type pillar layer interposed between the insulating films 41 does not deplete easily because the voltage is applied also to the insulating films 41; and the saturation drain current increases.

The structure illustrated in the invention can reduce power loss due to output capacitance Coss. By utilizing the structure illustrated in the invention, it is possible to reduce the ON resistance without increasing the impurity concentration of the n-type pillar layer 23, and to reduce the output capacitance depending on impurity concentrations of n-type and p-type pillar layers in the SJ. By forming the insulating films in the n-type pillar layer, it is possible to reduce the output capacitance more. Therefore, energy to charge or discharge the output capacitance can be small; and power loss can be reduced.

Here, it is sufficient for the silicon oxide film forming the insulating film 41 to be formed on the surface (the interface) of the n-type pillar layer 23 forming the trench 61 side walls. Therefore, it is acceptable for voids to form in the central portion of the trench 61, i.e., the central portion of the silicon oxide film. Further, in addition to thermal oxidation, the insulating film 41 may be formed by, for example, CVD (Chemical Vapor Deposition); and the insulating film 41 may be formed of not only a silicon oxide film but also a combined film of a silicon oxide film and a silicon nitride film, etc.

A variation of the first embodiment will now be described with reference to FIG. 2. This variation differs from the power semiconductor device 1 of the first embodiment in that the vertical direction (the Z-direction) of the insulating film is shorter. Components similar to those of the first embodiment are marked with like reference numerals, and a description thereof is omitted.

Figure 2:
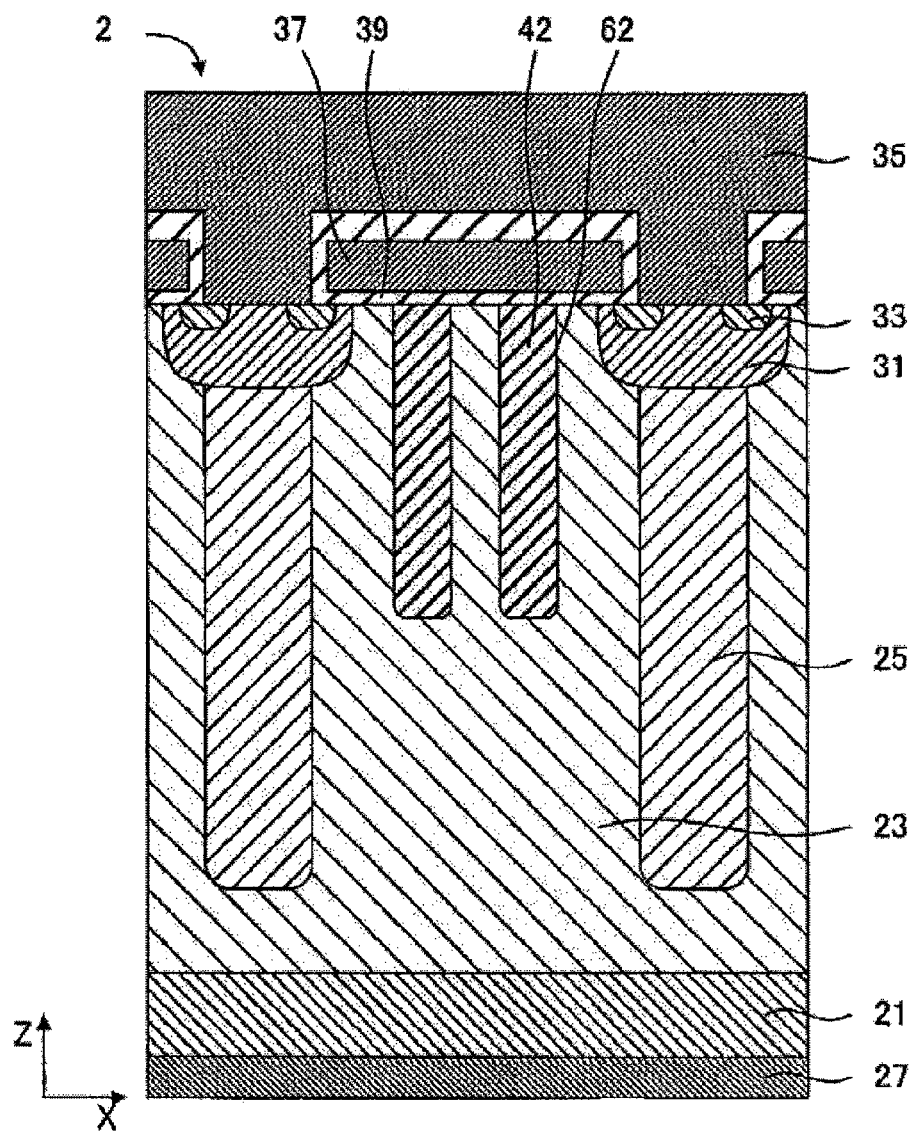
FIG. 2 is a cross-sectional view of a vertical direction schematically illustrating a power semiconductor device according to a variation of the first embodiment of the invention.

As illustrated in FIG. 2, a power semiconductor device 2 includes insulating films 42 having trench configurations disposed apart from each other and parallel to each other in the n-type pillar layer 23 and having lower faces positioned higher than the lower face of the p-type pillar layer 25. The insulating film 42 is formed of, for example, a silicon oxide film formed by thermal oxidation of a trench 62 made in the n-type pillar layer 23. Although the trench 62 is completely filled by the thermal oxidation, it is acceptable for voids to form in the central portion of the silicon oxide film. Each of the insulating films 42 has the same distance to the p-type pillar layer 25 on either side of the n-type pillar layer 23; and the lower faces of the insulating films 42 are positioned higher than the lower face of the p-type pillar layer 25, e.g., are positioned in the central portion of the p-type pillar layer 25 in the height direction (the Z-direction). Otherwise, the configuration is similar to the configuration of the power semiconductor device 1. The cross-sectional view of the planar direction passing through the insulating films 42 of FIG. 2 is similar to FIG. 1B.

Because the positions of the lower faces of the two rows of the insulating films 42 are higher in the power semiconductor device 2, the effects of the stress of the insulating films gradually decrease downward from the lower faces of the insulating films 42. Although the proportion of the reduction of the ON resistance is smaller than that of the power semiconductor device 1 because the stress applied to the n-type pillar layer 23 is lower, the power semiconductor device 2 similarly has the other effects of the power semiconductor device 1.

Because the depth of the insulating film 42, i.e., the trench 62, is shallow in the power semiconductor device 2, the manufacturing processes are not as difficult as those of the power semiconductor device 1; and the processing time can be shorter.

In the power semiconductor device 2, the trench 62 is made above and distal to the $n^+$-type drain layer 21. Because the $n^+$-type drain layer 21 is a high impurity concentration layer, the $n^+$-type drain layer 21 has low mechanical strength; and crystal defects easily occur. Therefore, it is possible to prevent cracks, etc., by making the trench 62 above and distal to the $n^+$-type drain layer 21. Accordingly, higher manufacturing yields and lower costs are possible in the power semiconductor device 2.

Second Embodiment

A power semiconductor device according to a second embodiment of the invention will now be described with reference to FIGS. 3A and 3B. The device differs from the power semiconductor device 1 of the first embodiment in that the pattern of insulating film has a broken line configuration when projected onto a plane. Components similar to those of the first embodiment are marked with like reference numerals, and a description thereof is omitted.

Figure 3A:
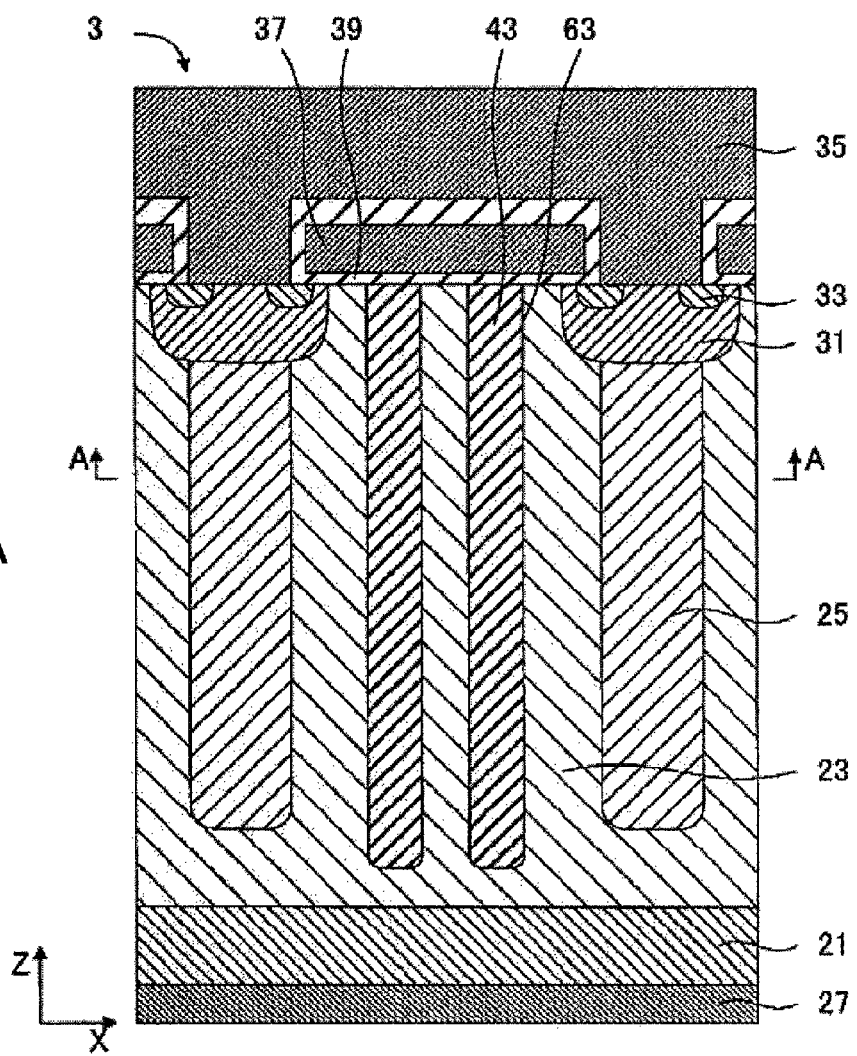
FIGS. 3A and 3B are views schematically illustrating a power semiconductor device according to a second embodiment of the invention.
Figure 3B:
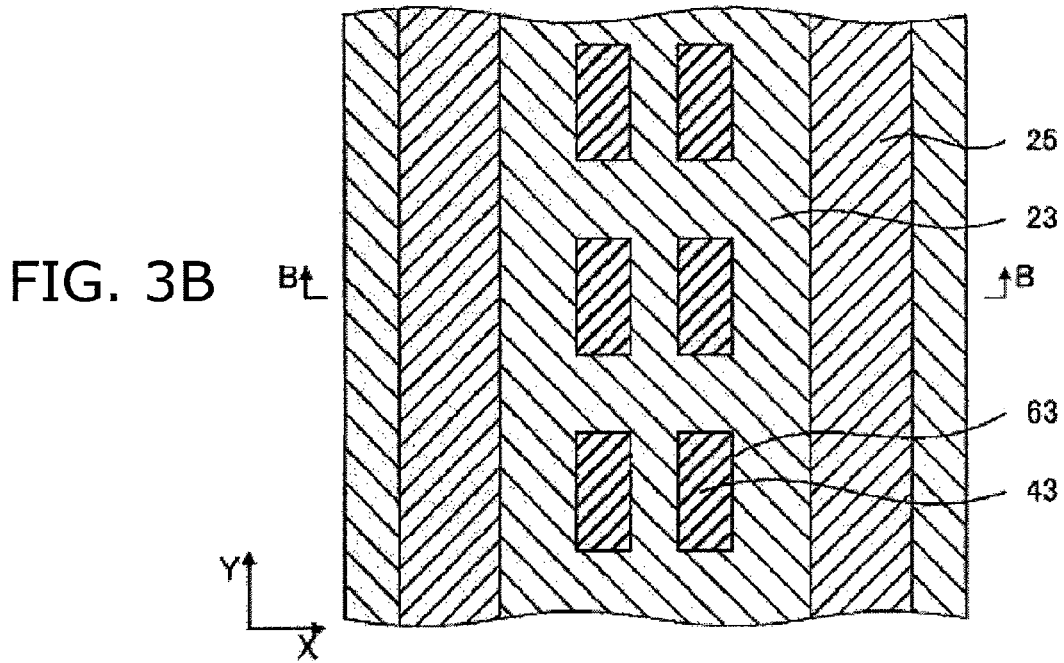

As illustrated in FIGS. 3A and 3B, the power semiconductor device 3 includes two rows of insulating films 43 in the n-type pillar layer 23. Each of the insulating films 43 is arranged in a broken line configuration (a broken line having lines and breaks in which the long side of the rectangle of the line is oriented in the arrangement direction) parallel to the direction (the Y-direction) in which the n-type pillar layer 23 and the p-type pillar layer 25 are extended. Each of the insulating films 43 has a striped configuration with breaks. Although the breaks of each of the mutually adjacent insulating films 43 are positioned to oppose each other, it is not always necessary for the breaks to be at opposing positions. Otherwise, the configuration is similar to the configuration of the power semiconductor device 1. The insulating film 43 is formed by filling a silicon oxide film into a trench 63.

Because each of the insulating films 43 is divided, the cross-sectional area of the n-type pillar layer 23 is increased by the portions in the breaks. Because the portions of the n-type pillar layer 23 exist in the breaks, the n-type pillar layer 23 between the insulating films 43 can be used as a current path. Although the surface area of the n-type pillar layer 23 contacting the insulating film 43 is substantially unchanged from that of the power semiconductor device 1, the amount of the n-type pillar layer 23 applied with stress and forming a current path increases. Accordingly, in the power semiconductor device 3, the ON resistance can be reduced even further from that of the power semiconductor device 1.

A first variation of the second embodiment will now be described with reference to FIG. 4A to FIG. 5B. This variation differs from the power semiconductor device 3 of the second embodiment in that the line configuration pattern of the insulating film is changed and the number of lines is increased. Components similar to those of the first and second embodiments and the variations are marked with like reference numerals, and a description thereof is omitted.

Figure 4A:
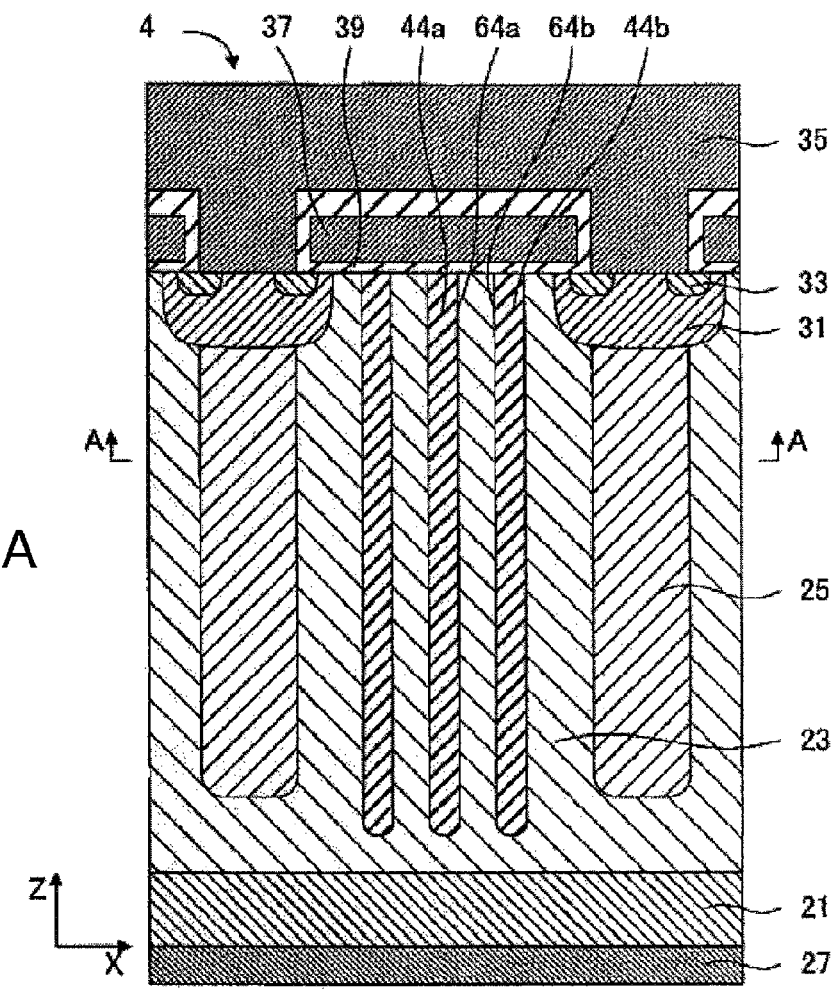
FIGS. 4A and 4B are views schematically illustrating a power semiconductor device according to a variation 1 of the second embodiment of the invention.
Figure 4B:
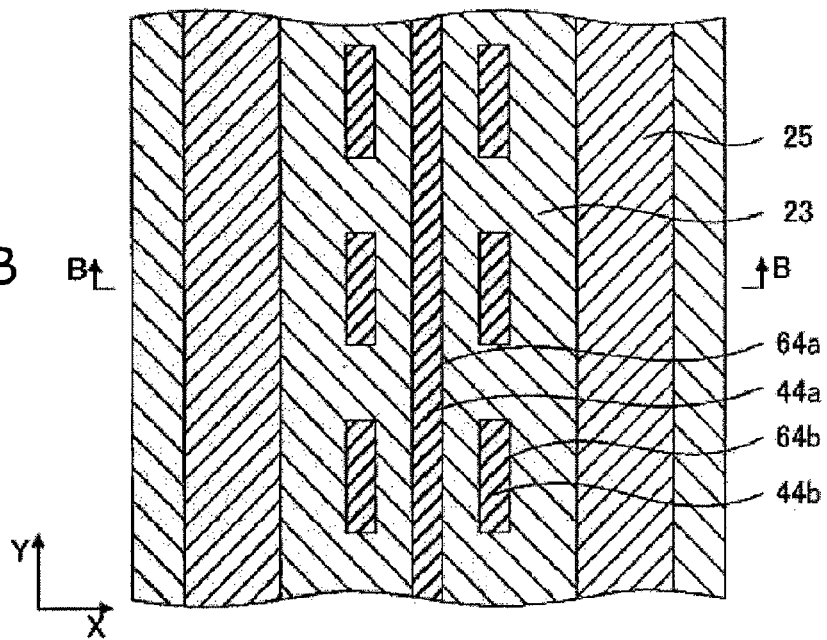

As illustrated in FIGS. 4A and 4B, a power semiconductor device 4 includes insulating films 44a and 44b made of two types of line configuration patterns in the n-type pillar layer 23. The insulating film 44a is interposed between the insulating films 44b on both sides. The insulating film 44a is arranged in a straight line configuration similar to that of the insulating film 41 of the power semiconductor device 1. The insulating film 44b is arranged in a broken line configuration similar to that of the insulating film 43 of the power semiconductor device 3 and is arranged apart from the insulating film 44a with equal spacing on both sides of the insulating film 44a. Because the three rows of the insulating films 44a and 44b are arranged in the n-type pillar layer 23, the X-direction widths of the insulating films 44a and 44b are smaller than the width of the insulating film 43 of the power semiconductor device 3. Otherwise, the configuration is similar to the configurations of the power semiconductor devices 1 and 3. The insulating films 44a and 44b are formed by filling trenches 64a and 64b with a silicon oxide film.

Figure 5A:
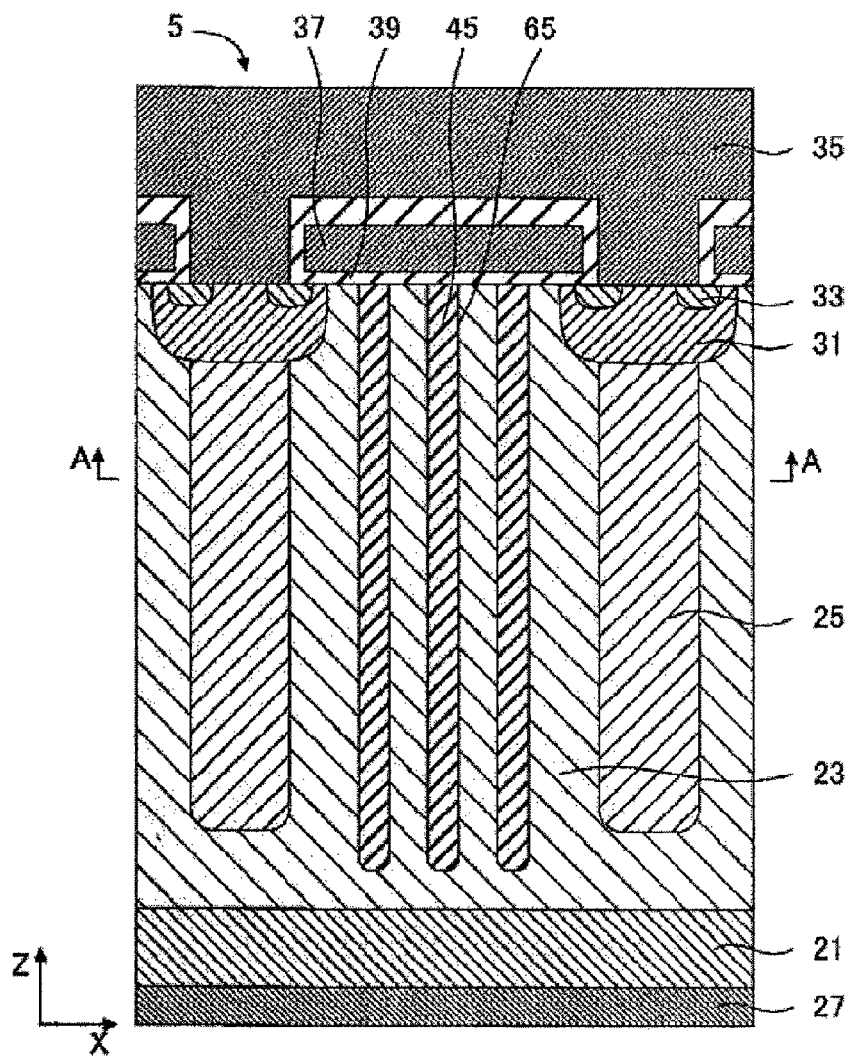
FIGS. 5A and 5B are views schematically illustrating a power semiconductor device according to a variation 1 of the second embodiment of the invention.
Figure 5B:
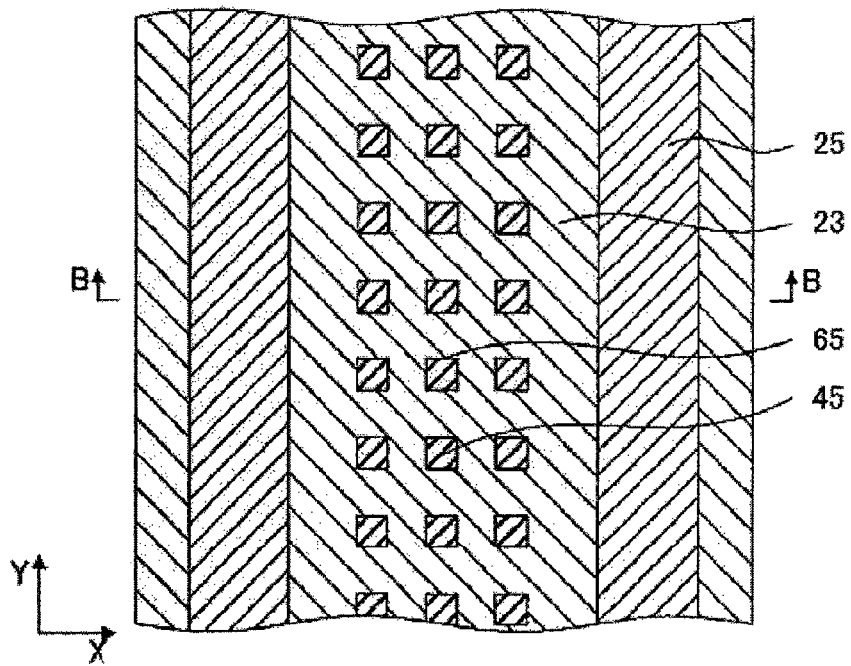

As illustrated in FIGS. 5A and 5B, in a power semiconductor device 5, three rows of insulating films 45 are arranged in the n-type pillar layer 23 in a dot configuration of squares, circles, etc., when projected onto a plane. The lengths in the extending direction (the Y-direction) are shorter than those of the insulating film 44b of the power semiconductor device 4. The insulating film 45 has a configuration in which the insulating films 44a and 44b of the power semiconductor device 4 are cut to be shorter in the Y-direction. The insulating film 45 is formed by filling a silicon oxide film into a trench 65.

In the power semiconductor device 4, in addition to the effects of the power semiconductor device 3, the effects of the insulating film 44a applying stress to the n-type pillar layer 23 are added; and it is possible to reduce the ON resistance even further. In the power semiconductor device 5, in addition to the effects of the power semiconductor device 4, the insulating film 45 is more subdivided; there are more breaks; and it is possible to reduce the ON resistance by the amount of the increase of the n-type pillar layer 23 even though the contact surface area with the n-type pillar layer 23 substantially does not change.

A second variation of the second embodiment will now be described with reference to FIG. 6A to FIG. 7B. This variation differs from the power semiconductor device 3 of the second embodiment in that the insulating film has a wider distribution when projected onto a plane. Components similar to those of the first and second embodiments and the variations are marked with like reference numerals, and a description thereof is omitted.

Figure 6A:
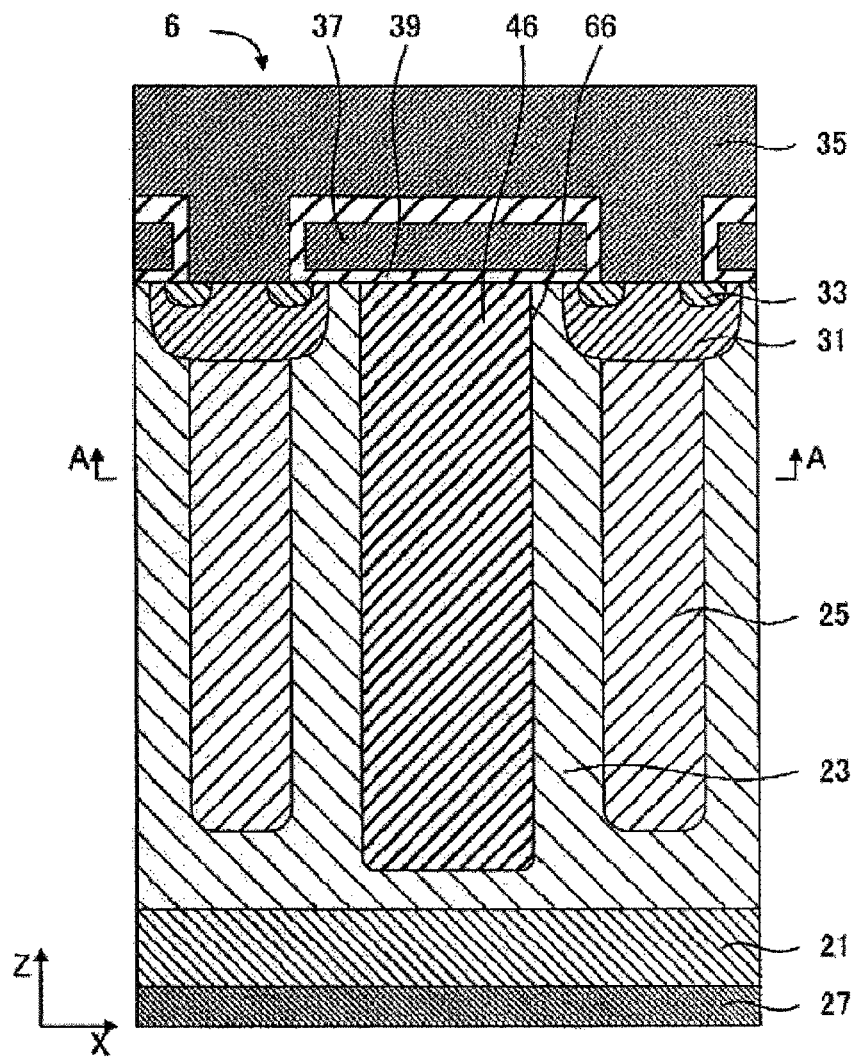
FIGS. 6A and 6B are views schematically illustrating a power semiconductor device according to a variation 2 of the second embodiment of the invention.
Figure 6B:
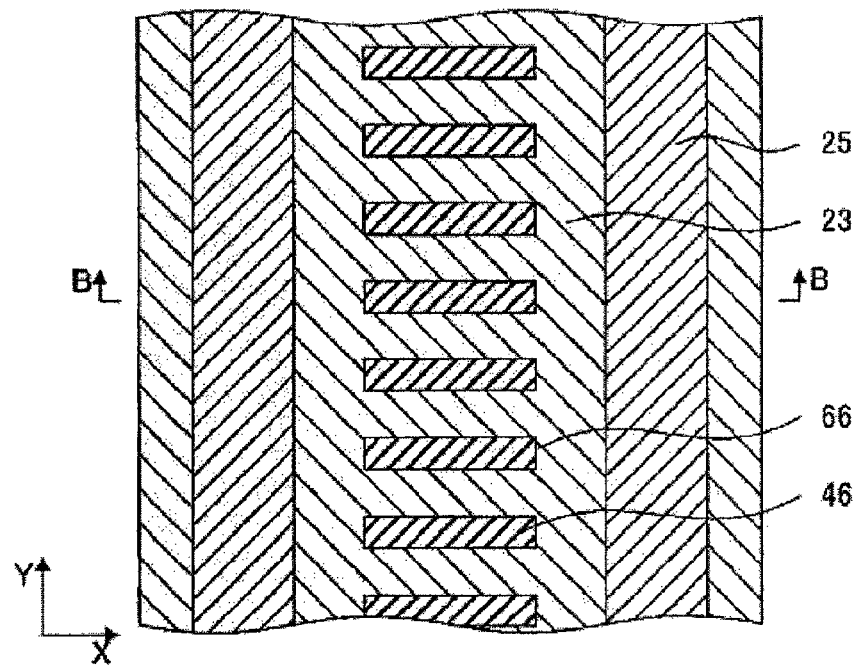

As illustrated in FIGS. 6A and 6B, a power semiconductor device 6 includes an insulating film 46 which spreads in the left/right page surface direction (the X-direction) of FIG. 6B and is repeatedly provided in the n-type pillar layer 23 in the up/down page surface direction (the Y-direction). For example, while an insulating film 43a of the power semiconductor device 3 has a broken line configuration, the direction (the Y-direction) in which the insulating film 46 is repeated is perpendicular to the spreading direction (the X-direction) of the long side of the rectangle. Otherwise, the configuration is similar to that of the power semiconductor device 3. The insulating film 46 is formed by filling a silicon oxide film into a trench 66.

Figure 7A:
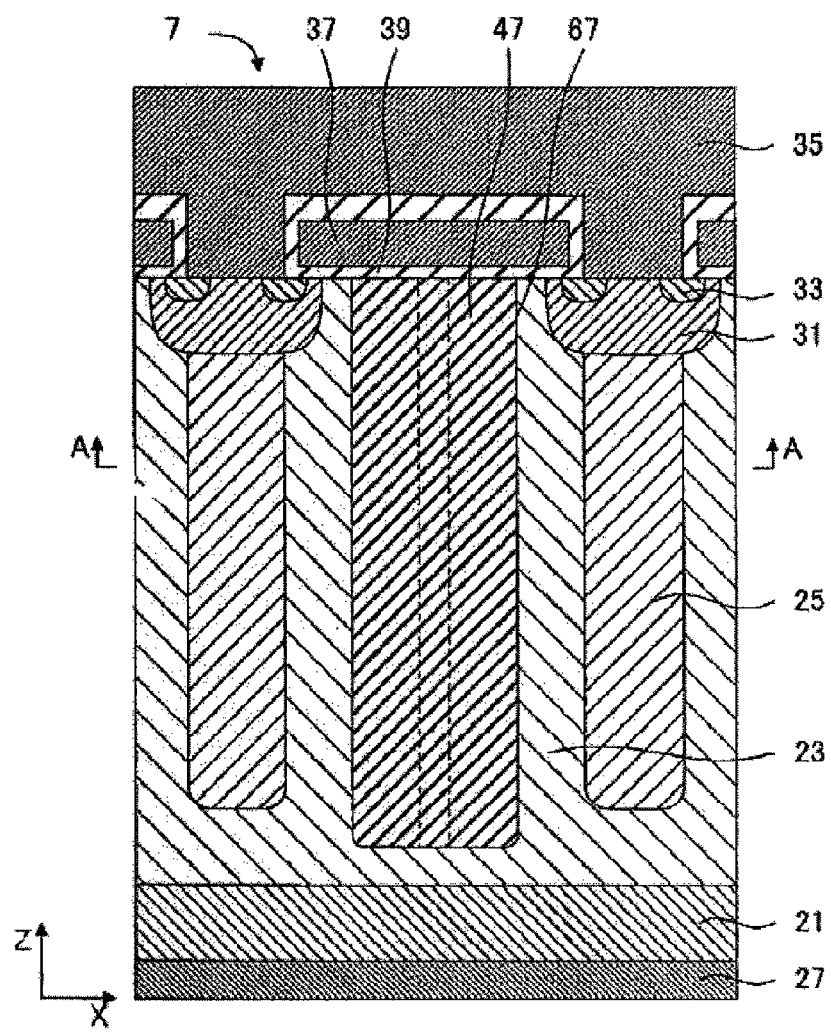
FIGS. 7A and 7B are views schematically illustrating a power semiconductor device according to a variation 2 of the second embodiment of the invention.
Figure 7B:
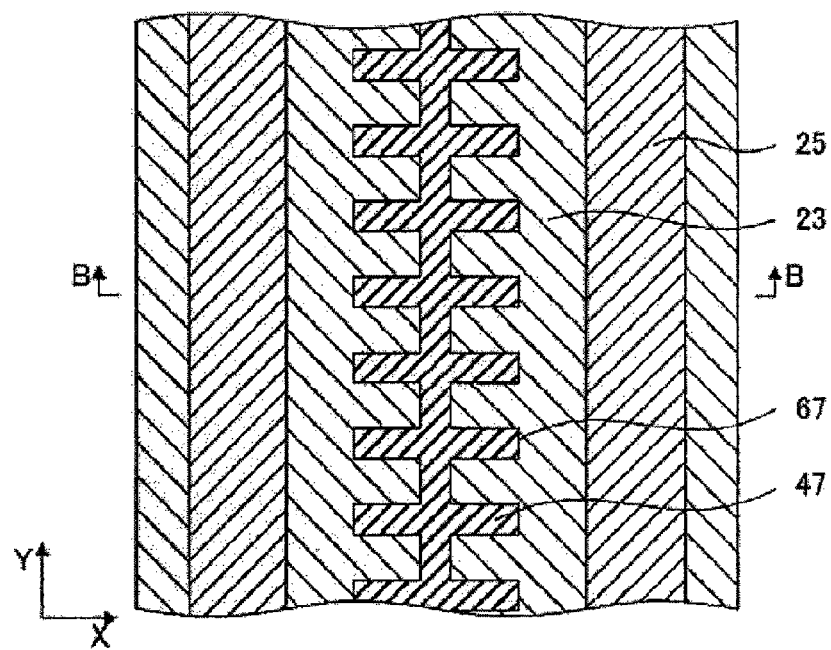

As illustrated in FIGS. 7A and 7B, an insulating film 47 of a power semiconductor device 7 has a double tooth comb-shaped configuration when projected onto a plane, being extended in the up/down page surface direction (the Y-direction) of FIG. 7B. The pattern of the insulating film 47 has a planar configuration in which an insulating film extended in the Y-direction is added to the center of the insulating film 46 of the power semiconductor device 6. Otherwise, the configuration is similar to the configuration of the power semiconductor device 6. The insulating film 47 is formed by filling a silicon oxide film into a trench 67. The insulating film 47 may have a configuration in which breaks are provided in the Y-direction to form a subdivided double tooth comb-shaped configuration.

The power semiconductor device 6 has effects similar to the effects of the power semiconductor device 3. It is possible to design the period of the repetition of the insulating film 46 independently from the period of the SJ structure of the n-type pillar layer 23 and the p-type pillar layer 25. In the power semiconductor device 7, in addition to the effects of the power semiconductor device 6, the stress applied to the n-type pillar layer 23 by the insulating film extended in the Y-direction increases; and it is possible to decrease the ON resistance.

A third variation of the second embodiment will now be described with reference to FIG. 8A to FIG. 10B. The third variation of the second embodiment includes the feature that the n-type pillar layer spreads out in a two-dimensional lattice configuration; and the insulating films are spread out two-dimensionally in the n-type pillar layer. Components similar to those of the first and second embodiments and the variations are marked with like reference numerals, and a description thereof is omitted.

Figure 8A:
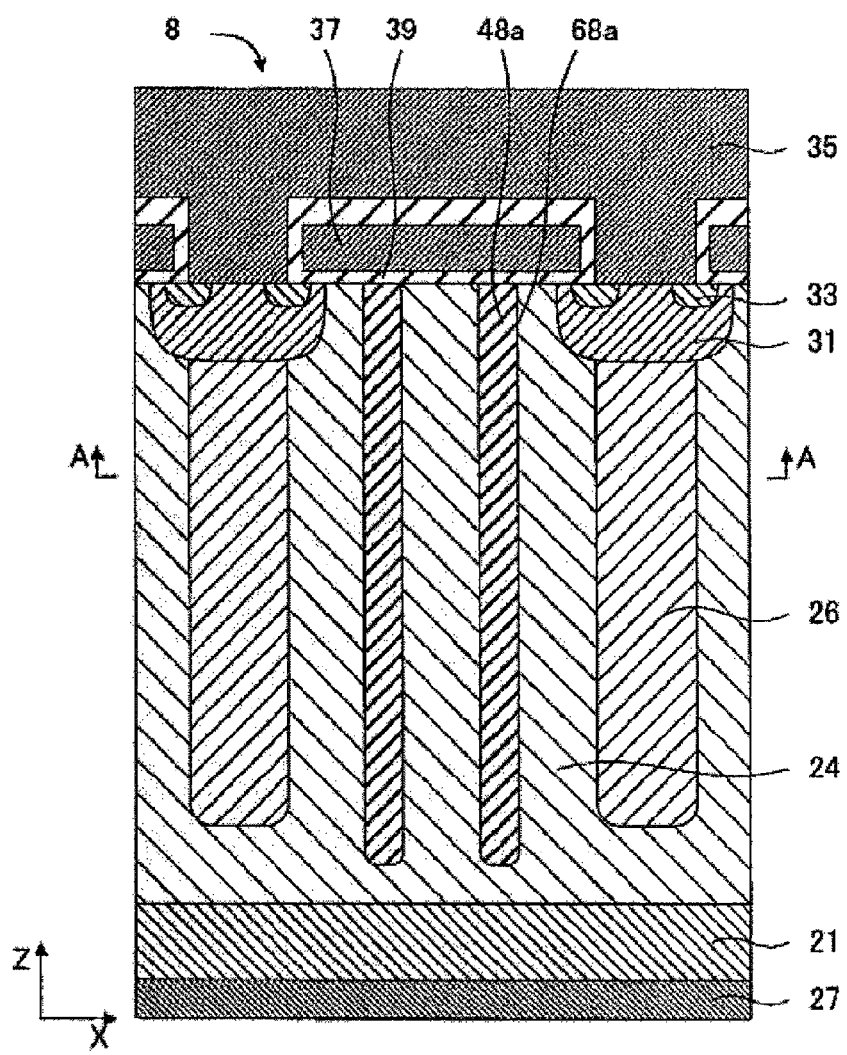
FIGS. 8A and 8B are views schematically illustrating a power semiconductor device according to a variation 3 of the second embodiment of the invention.
Figure 8B:
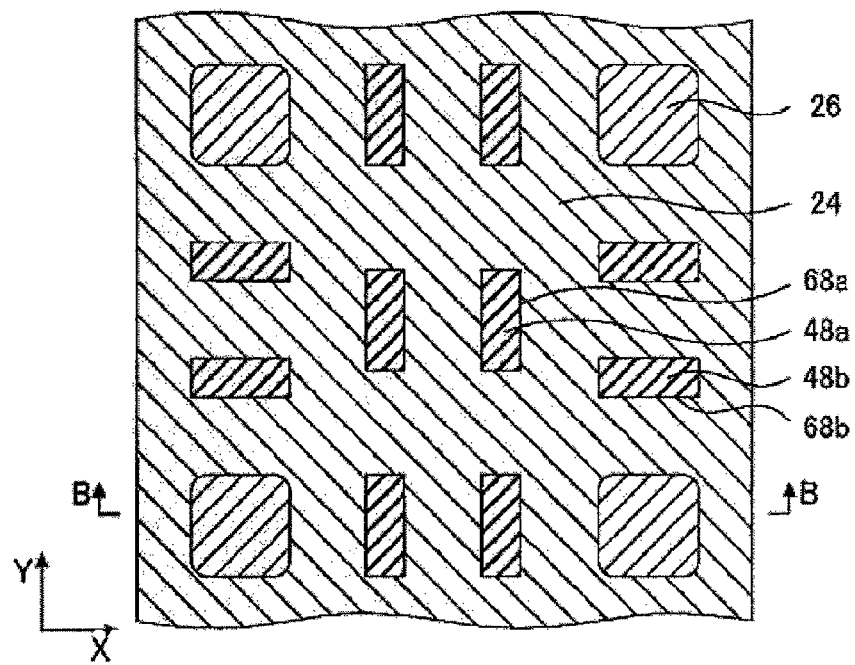

In a power semiconductor device 8 as illustrated in FIGS. 8A and 8B, the SJ structure is formed of a pattern in which the n-type pillar layer 24 spreads out in a two-dimensional lattice configuration and a p-type pillar layer 26 exists at positions corresponding to lattice points. The p-type pillar layer 26 has, for example, a quadrilateral columnar configuration extending in the Z-direction with a rectangular cross section. An n-type pillar layer 24 encloses the p-type pillar layer 26 to bury the p-type pillar layer 26. Insulating films 48a and 48b are arranged in broken line configurations in the n-type pillar layer 24 in the Y-direction and the X-direction, respectively.

Two rows of the insulating films 48a or the insulating films 48b are arranged between the two most proximal p-type pillar layers 26; and two rows of the insulating films 48a or the insulating films 48b are disposed in the central portion of the smallest rectangle formed by four of the p-type pillar layers 26. The insulating films 48a and 48b are formed by filling a silicon oxide film into trenches 68a and 68b.

Figure 9A:
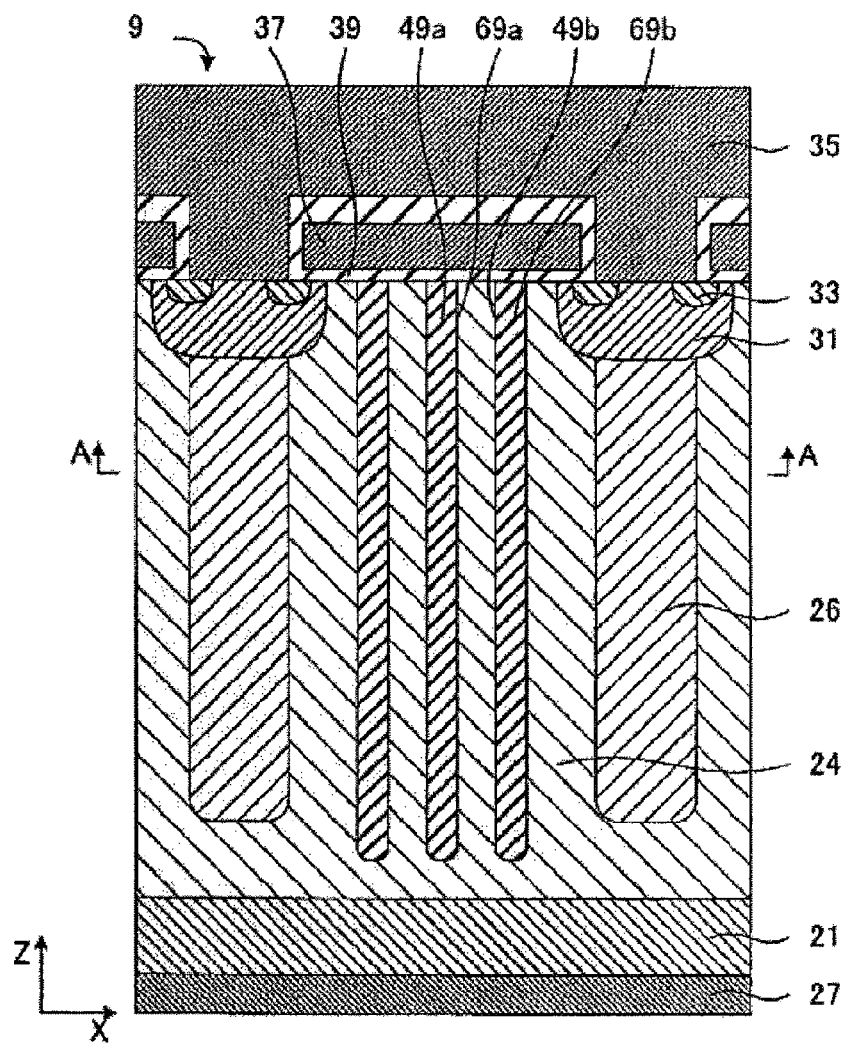
FIGS. 9A and 9B are views schematically illustrating a power semiconductor device according to a variation 3 of the second embodiment of the invention.
Figure 9B:
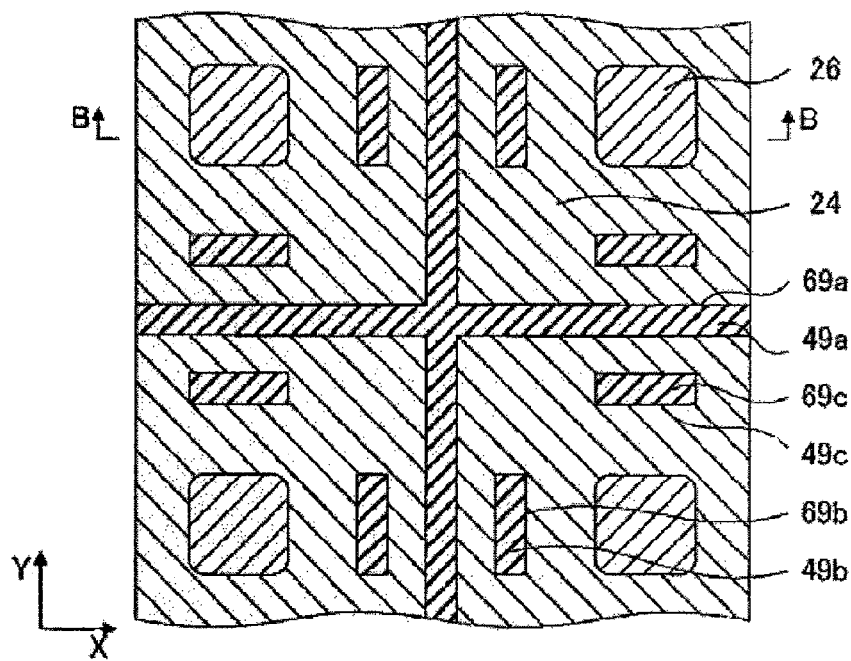

As illustrated in FIGS. 9A and 9B, a power semiconductor device 9 includes the n-type pillar layer 24 and the p-type pillar layer 26 similar to those of the power semiconductor device 8. Insulating films 49a, 49b, and 49c are arranged in the n-type pillar layer 24. The insulating film 49a is disposed in a lattice configuration in the X-direction and the Y-direction; and each of the insulating films 49b and 49c is arranged in parallel in a broken line configuration along the insulating film 49a. The lattice forming the insulating film 49a has the same configuration as the lattice forming the n-type pillar layer 24 and the p-type pillar layer 26. The insulating film 49a is disposed in the central portion between the two most proximal p-type pillar layers 26; and the insulating film 49b or the insulating film 49c is arranged on both sides of the insulating film 49a. The intersection of the insulating film 49a having the lattice configuration is disposed in the central portion of the smallest rectangle formed by four of the p-type pillar layers 26. The insulating films 49a, 49b, and 49c are formed by filling a silicon oxide film into trenches 69a, 69b, and 69c.

Figure 10A:
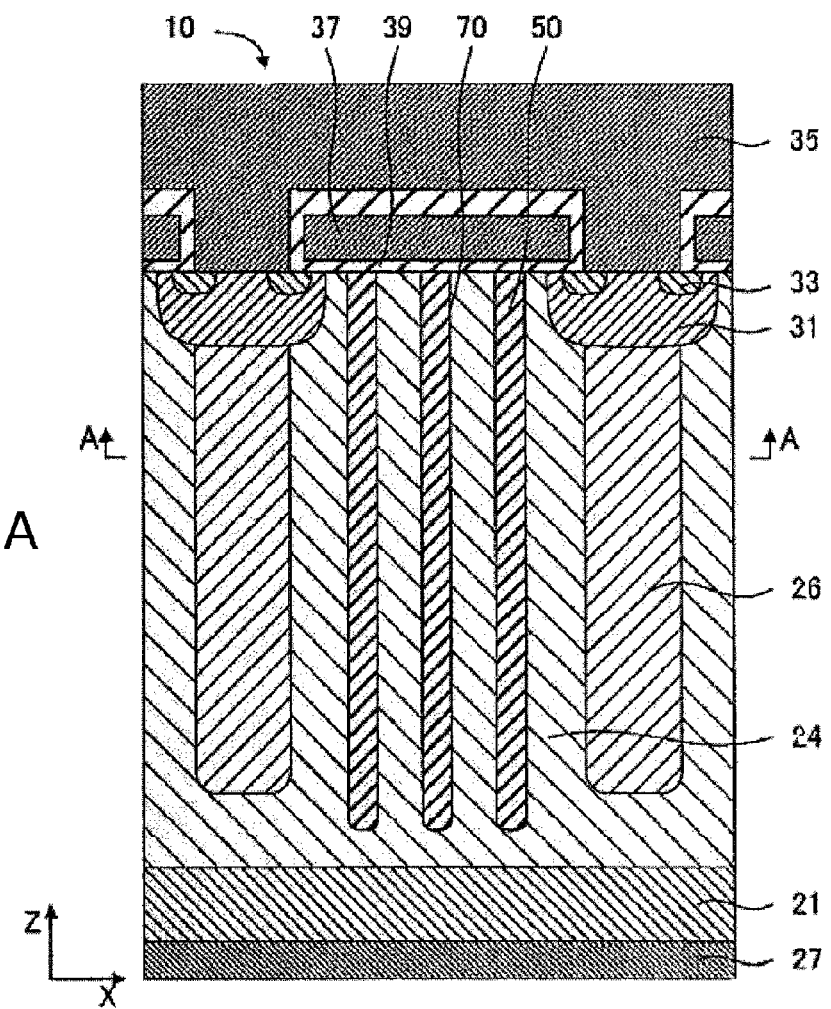
FIGS. 10A and 10B are views schematically illustrating a power semiconductor device according to a variation 3 of the second embodiment of the invention.
Figure 10B:
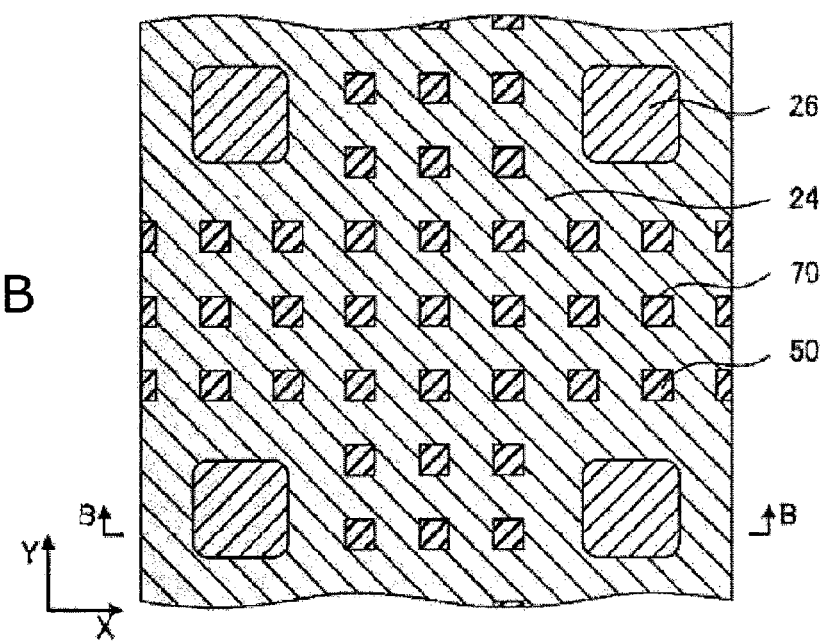

As illustrated in FIGS. 10A and 10B, a power semiconductor device 10 includes the n-type pillar layer 24 and the p-type pillar layer 26 similar to those of the power semiconductor devices 8 and 9. An insulating film 50 is arranged in the n-type pillar layer 24 in a dotted line configuration or a dot configuration in the X-direction and the Y-direction. Three rows of the insulating films 50 are arranged in a dotted line configuration between the two most proximal p-type pillar layers 26. The insulating film 50 is distributed in a dotted line configuration arranged in the X-direction and the Y-direction in the central portion of the smallest rectangle formed by four of the p-type pillar layers 26. The insulating film 50 is formed by filling a silicon oxide film into a trench 70.

In the power semiconductor device 8, the n-type pillar layer 24 is disposed two-dimensionally around the p-type pillar layers 26; the current path is ensured around the p-type pillar layers 26; and the insulating films 48a and 48b are disposed around the current path to partially ensure planar current paths. Therefore, it is possible to reduce the ON resistance. Further, the power semiconductor device 8 has effects similar to the effects of the power semiconductor device 3. In the power semiconductor device 9, in addition to the effects of the power semiconductor device 8, the stress applied to the n-type pillar layer 24 by the insulating film 49a having the lattice configuration is increased. Thereby, it is possible to decrease the ON resistance even more. In the power semiconductor device 10, compared to the power semiconductor devices 8 and 9, it is possible to ensure a greater cross-sectional area of the n-type pillar layer 24, i.e., the current path, without decreasing the stress applied to the n-type pillar layer 24 by the insulating film 50. Therefore, it is possible to reduce the ON resistance even further.

Third Embodiment

A power semiconductor device according to a third embodiment of the invention will now be described with reference to FIGS. 11A and 11B. The device differs from the power semiconductor device 3 of the second embodiment in that the insulating film is provided in the boundary region between the n-type pillar layer and the p-type pillar layer. Components similar to those of the first and second embodiments and the variations are marked with like reference numerals, and a description thereof is omitted.

Figure 11A:
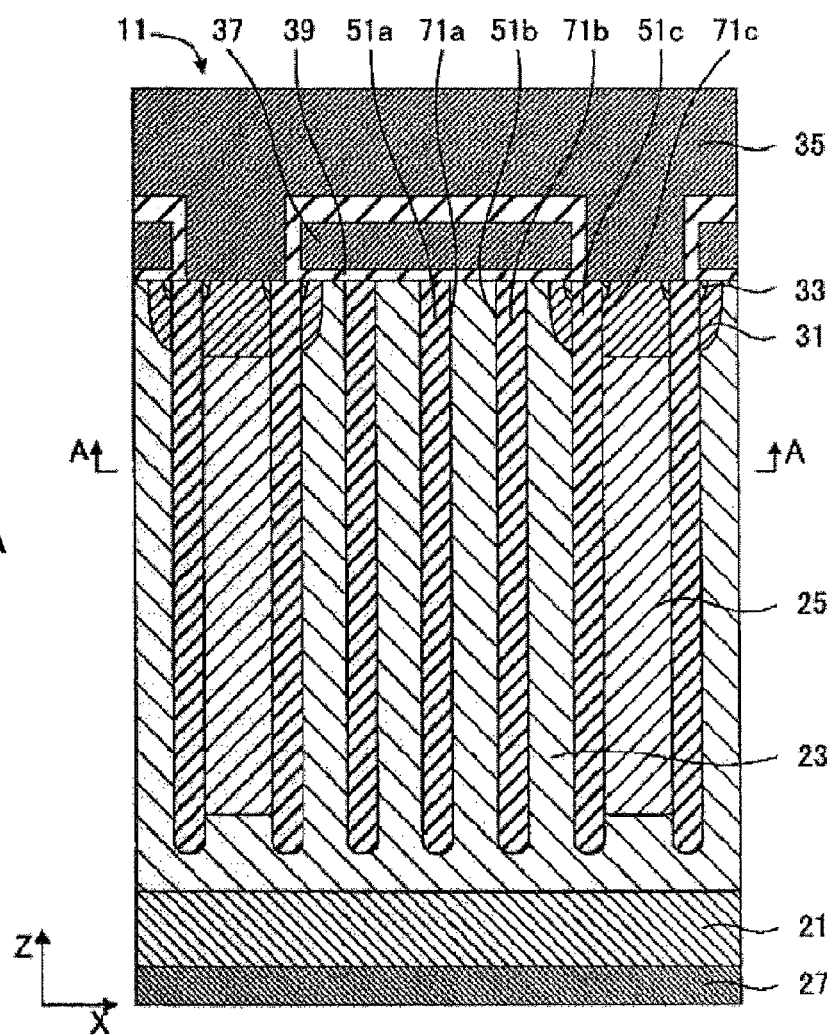
FIGS. 11A and 11B are views schematically illustrating a power semiconductor device according to a third embodiment of the invention.
Figure 11B:
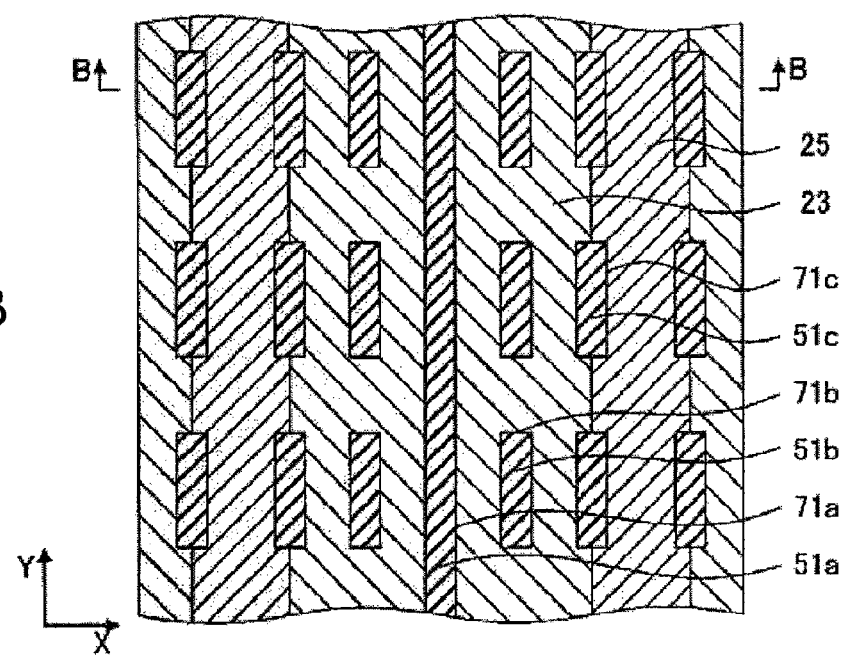

As illustrated in FIGS. 11A and 11B, the power semiconductor device 11 includes three rows of two types of insulating films 51a and 51b in the n-type pillar layer 23 and an insulating film 51c in the boundary region between the n-type pillar layer 23 and the p-type pillar layer 25. The insulating films 51a and 51b correspond to the insulating films 44a and 44b of the power semiconductor device 4, respectively. The insulating film 51c has a configuration in which an insulating film similar to the insulating film 51b having the broken line configuration is copied on the boundary region between the n-type pillar layer 23 and the p-type pillar layer 25. The upper end portion of the insulating film 51c pierces the p-type base layer 31 and may contact a portion of the n-type source layer 33. The insulating film 51c substantially does not affect the channel. The insulating films 51a, 51b, and 51c are formed by filling a silicon oxide film into trenches 71a, 71b, and 71c, respectively.

In the power semiconductor device 11, in the case where the drain voltage is increased in the ON state, a voltage is applied to the insulating film 51c in the trench 71c; and the depletion layer does not extend easily into the n-type pillar layer 23. Thereby, the saturation drain current can be increased. Otherwise, the power semiconductor device 11 has effects similar to those of the power semiconductor device 4.

A variation of the third embodiment recited above will now be described with reference to FIGS. 12A and 12B. This variation differs from the power semiconductor device 11 of the third embodiment in that the insulating film is arranged in a dotted line configuration. Components similar to those of the first to third embodiments and the variations are marked with like reference numerals, and a description thereof is omitted.

Figure 12A:
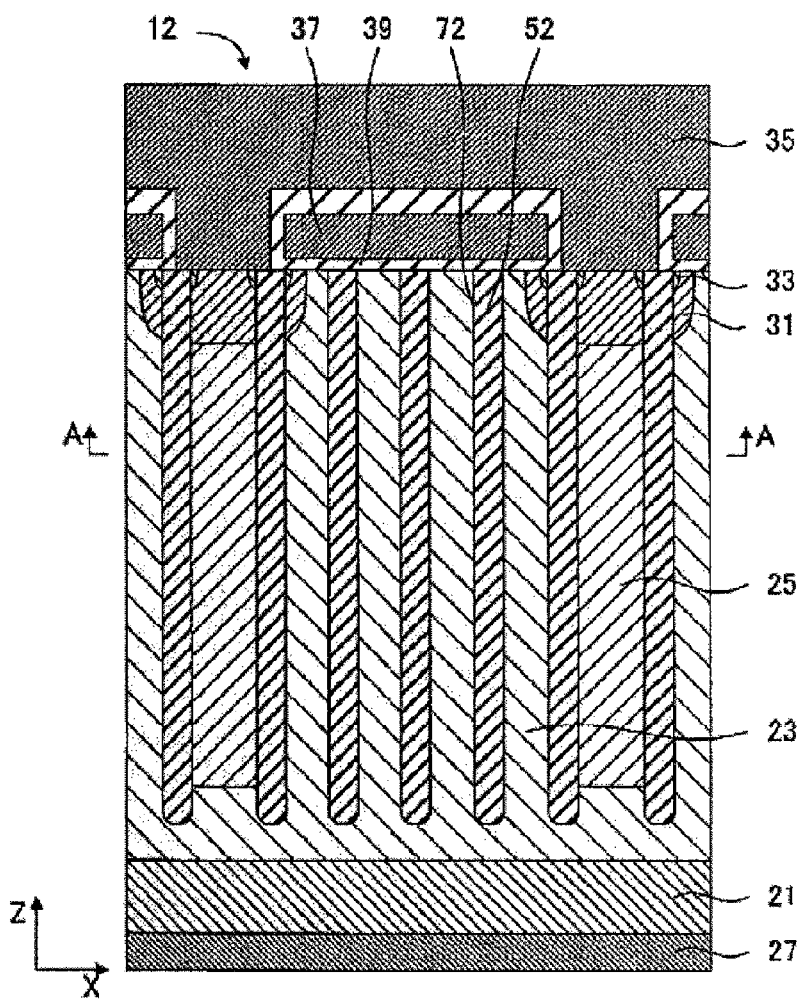
FIGS. 12A and 12B are views schematically illustrating a power semiconductor device according to a variation of the third embodiment of the invention.
Figure 12B:
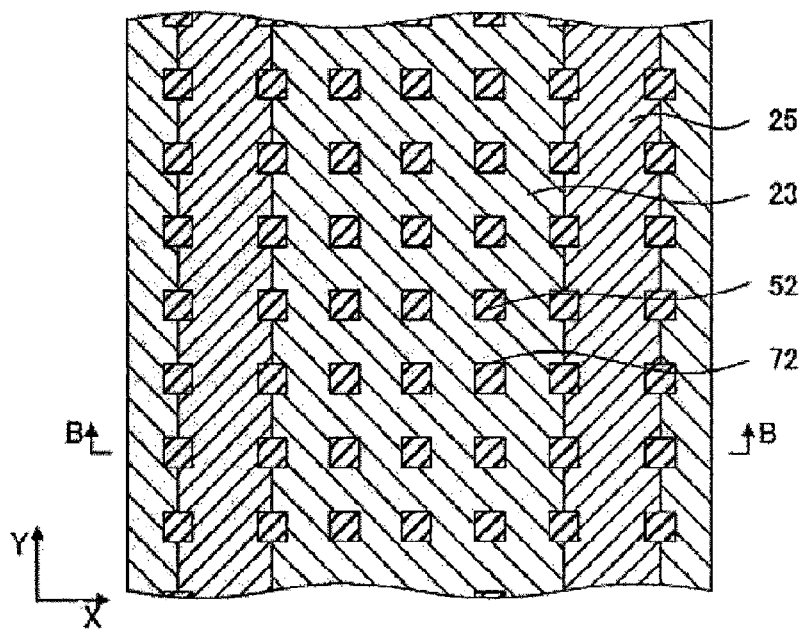

As illustrated in FIGS. 12A and 12B, a power semiconductor device 12 includes three rows of insulating films 52 in the n-type pillar layer 23 and includes the insulating film 52 in the boundary region between the n-type pillar layer 23 and the p-type pillar layer 25. The insulating film 52 is arranged in a dotted line configuration or a dot configuration in the Y-direction and has a configuration similar to that of the insulating film 50 of the power semiconductor device 10. The insulating film 52 is formed by filling a silicon oxide film into a trench 72.

The power semiconductor device 12 has effects similar to those of the power semiconductor device 11. Further, in the power semiconductor device 12, compared to the power semiconductor device 11, it is possible to ensure a greater cross-sectional area of the n-type pillar layer 23, i.e., the current path, without decreasing the stress applied to the n-type pillar layer 23 by the insulating film 52. Therefore, it is possible to reduce the ON resistance even further.

Fourth Embodiment

A power semiconductor device according to a fourth embodiment of the invention will now be described with reference to FIGS. 13A and 13B. The device differs from the power semiconductor device 1 of the first embodiment in that the insulating film is disposed in the p-type base layer and the p-type pillar layer; and it is possible to apply a compressive stress. Components similar to those of the first to third embodiments and the variations are marked with like reference numerals, and a description thereof is omitted.

Figure 13A:
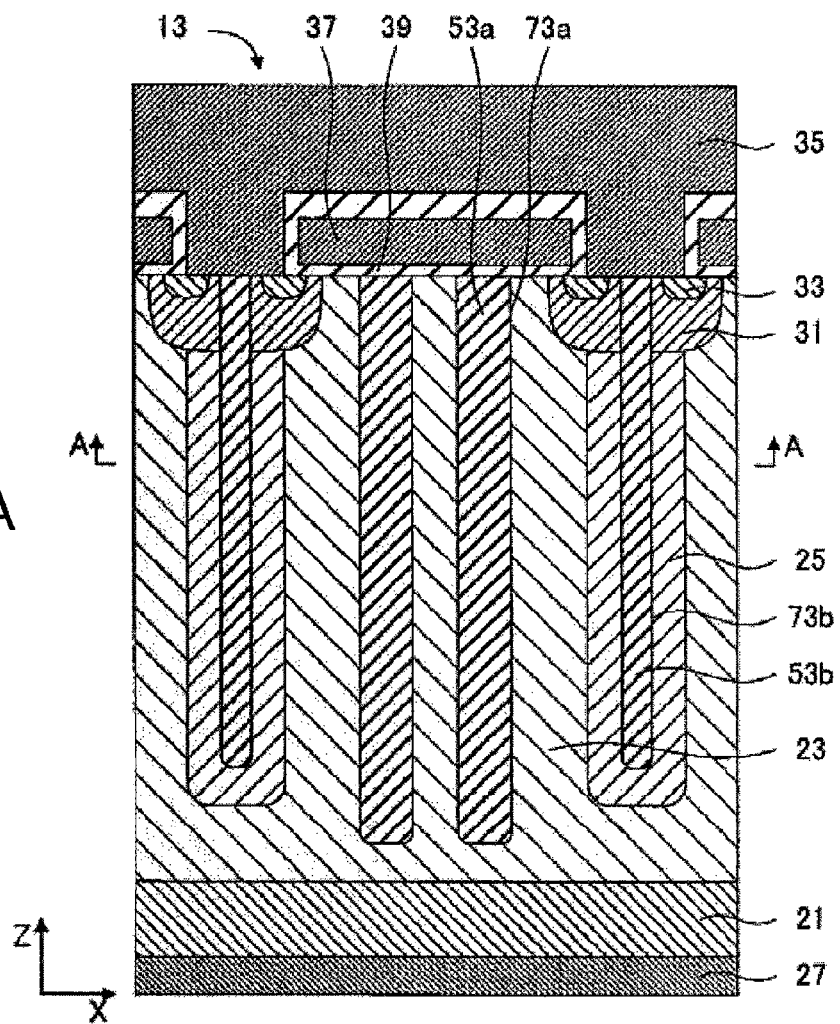
FIGS. 13A and 13B are views schematically illustrating a power semiconductor device according to a fourth embodiment of the invention.
Figure 13B:
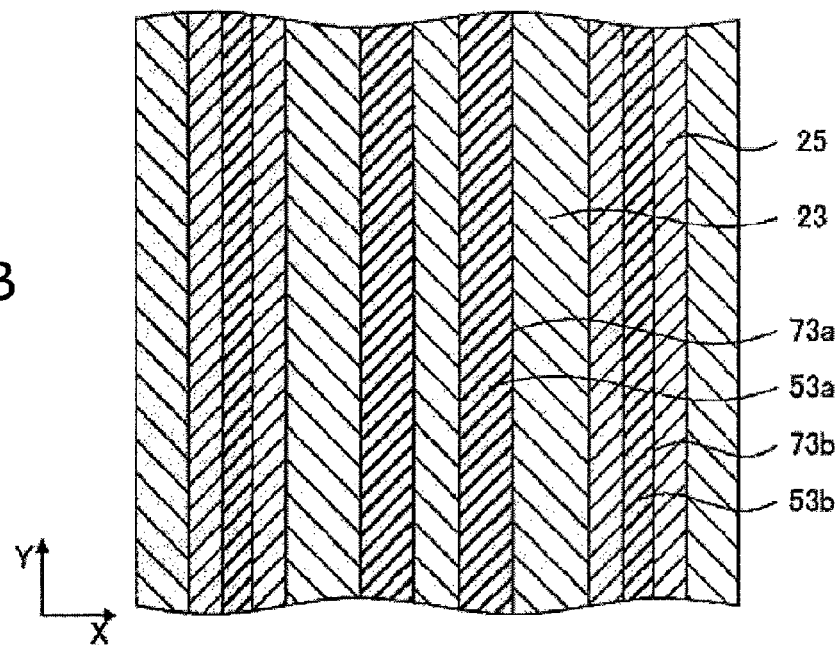

As illustrated in FIGS. 13A and 13B, the power semiconductor device 13 includes two rows of a first insulating films 53a made of a silicon oxide film in the n-type pillar layer 23 similar to the insulating film 41 of the power semiconductor device 1, and includes a second insulating film 53b made of a silicon nitride film disposed in the p-type base layer 31 and the p-type pillar layer 25. The first insulating film 53a is formed by filling a silicon oxide film into a trench 73a. The second insulating film 53b is formed by filling a silicon nitride film into a trench 73b which pierces the p-type base layer 31 and reaches an interior of the p-type pillar layer 25 proximal to the lower end of the p-type pillar layer 25. The upper end of the second insulating film 53b contacts the source electrode 35; the lower end of the second insulating film 53b is proximal to the bottom face of the n-type pillar layer 23; and the second insulating film 53b is disposed parallel to the first insulating film 53a.

The silicon nitride film forming the second insulating film 53b contacting the trench 73b side wall in the silicon forming the p-type pillar layer 25 will now be described. By forming the silicon nitride film (the second insulating film 53b) on the surface of the silicon (the trench 73b side wall), a compressive stress occurs in the direction along the surface of the second insulating film 53b. It is well-known that such stress increases the mobility of holes; and due to the increase of the hole mobility, the holes produced during avalanche breakdown can be quickly discharged.

By the first insulating film 53a in the n-type pillar layer 23, the power semiconductor device 13 has effects similar to those of the power semiconductor device 1. Further, because of the second insulating film 53b in the p-type base layer 31 and the p-type pillar layer 25 in the power semiconductor device 13, negative resistance due to parasitic bipolar transistor operations and the like do not easily occur; and the avalanche energy increases.

A variation of the fourth embodiment will now be described with reference to FIGS. 14A and 14B. This variation differs from the power semiconductor device 13 of the fourth embodiment in that the vertical direction (the Z-direction) of the second insulating film is shorter. Components similar to those of the first to fourth embodiments and the variations thereof are marked with like reference numerals, and a description thereof is omitted.

Figure 14A:
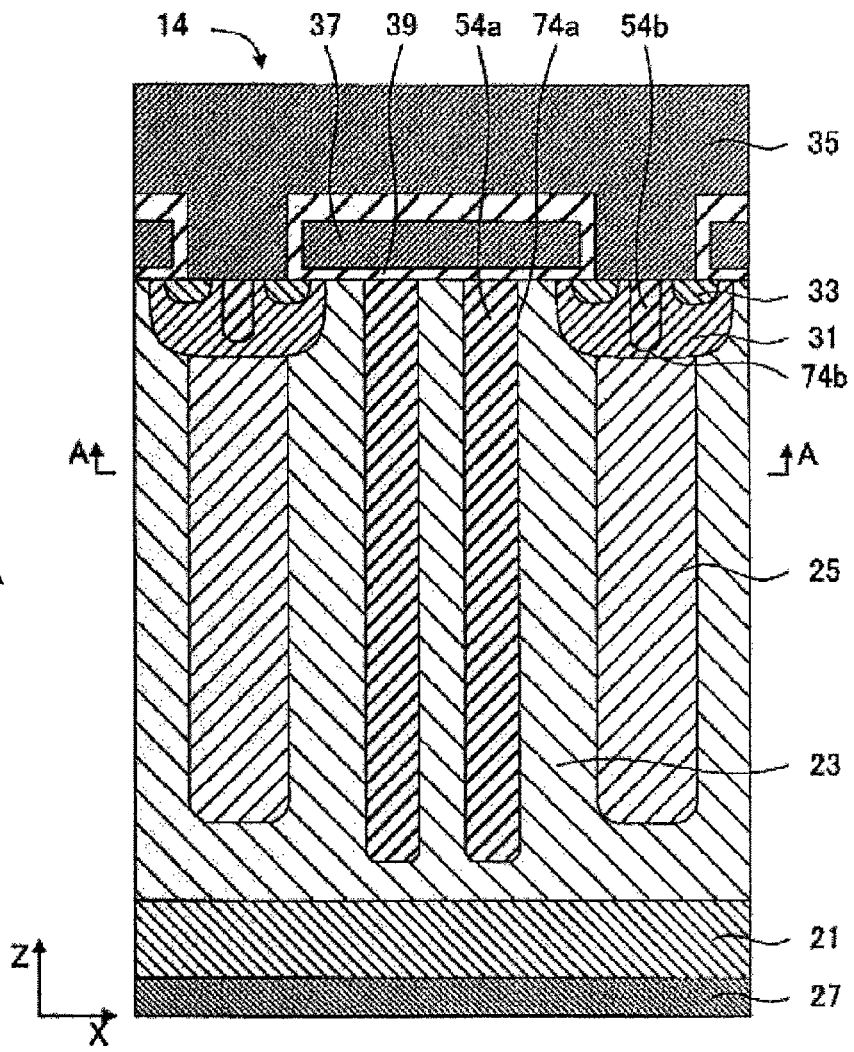
FIGS. 14A and 14B are views schematically illustrating a power semiconductor device according to a variation of the fourth embodiment of the invention.
Figure 14B:
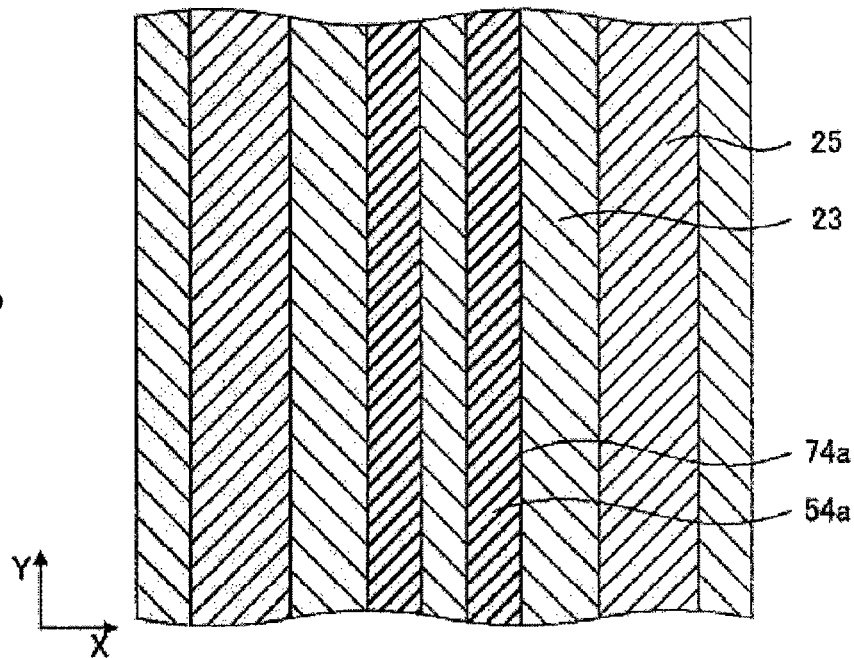

As illustrated in FIGS. 14A and 14B, a power semiconductor device 14 includes a second insulating film 54b made of a silicon nitride film in which the lower end side in the Z-direction is shorter such that the second insulating film 54b is disposed in the p-type base layer 31. In the power semiconductor device 14, the second insulating film 54b is disposed only in the p-type base layer 31. Otherwise, the power semiconductor device 14 is similar to the power semiconductor device 13.

Because of a first insulating film 54a in the n-type pillar layer 23, the power semiconductor device 14 has effects similar to those of the power semiconductor device 1. Further, because of the second insulating film 54b in the p-type base layer 31 in the power semiconductor device 14, negative resistance due to parasitic bipolar transistor operations and the like do not occur easily; and the avalanche energy increases. While the proportion of the increase of the hole mobility is small in the power semiconductor device 14 compared to the power semiconductor device 13 because substantially no stress is applied to the p-type pillar layer 25, the difficulty of the manufacturing processes is reduced by the second insulating film 54b being shallow; and the processing time is shorter.

Fifth Embodiment

A power semiconductor device according to a fifth embodiment of the invention will now be described with reference to FIG. 15. The device differs from the power semiconductor device 13 of the fourth embodiment in that the insulating film is a high dielectric constant film disposed in the p-type base layer and the p-type pillar layer. Components similar to those of the first to fourth embodiments and the variations are marked with like reference numerals, and a description thereof is omitted.

Figure 15:
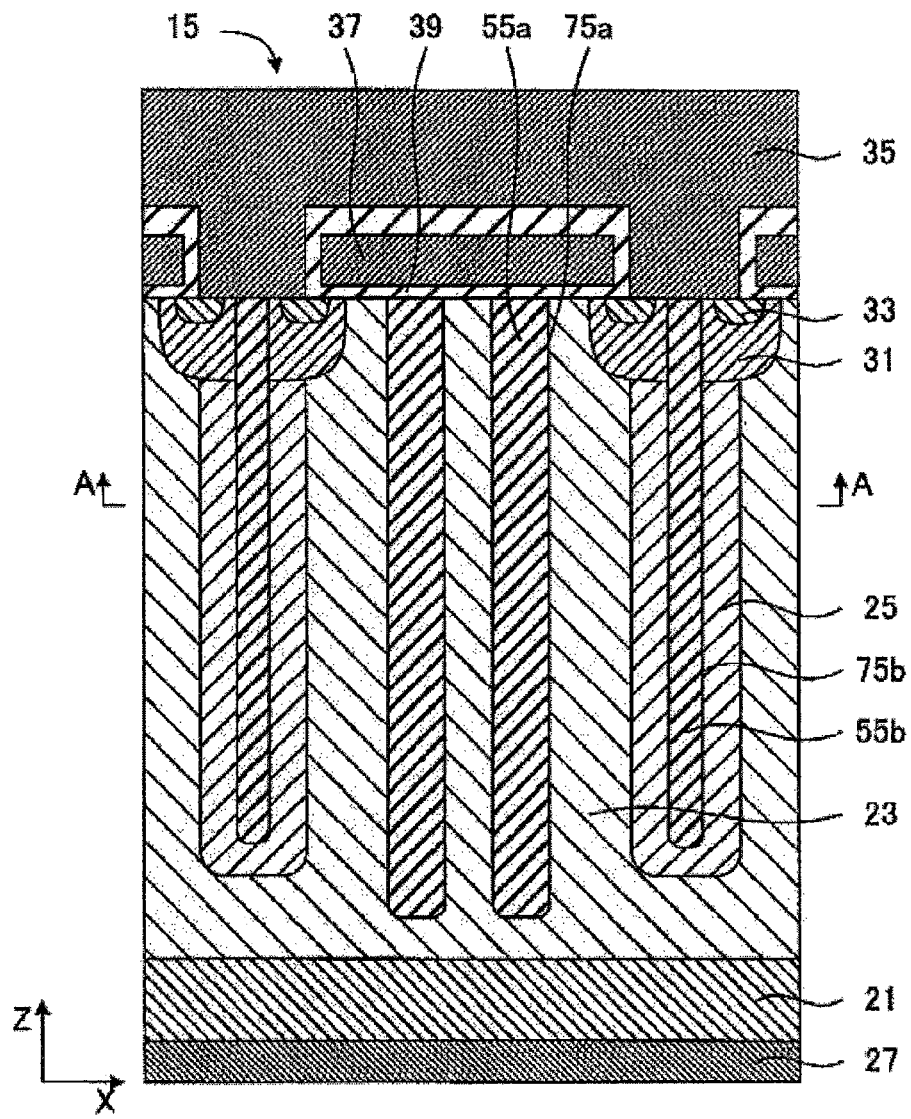
FIG. 15 is a cross-sectional view of the vertical direction schematically illustrating a power semiconductor device according to a fifth embodiment of the invention.

As illustrated in FIG. 15, the configurations of trenches 75a and 75b of the power semiconductor device 15 are similar to those of the power semiconductor device 13 of the fourth embodiment. A first insulating film 55a made of a silicon oxide film is filled into the trench 75a in the n-type pillar layer 23. A third insulating film 55b made of a high dielectric constant film is filled into the trench 75b in the p-type base layer 31 and the p-type pillar layer 25. The third insulating film 55b is made of, for example, hafnium oxide (HfOx), zirconium oxide (ZrOx), tantalum oxide (TaOx), etc., and is an oxide film having a relative dielectric constant higher than that of the silicon oxide film.

Because of the first insulating film 55a in the n-type pillar layer 23, the power semiconductor device 15 has effects similar to those of the power semiconductor device 1. Further, by arranging the third insulating film 55b having the higher relative dielectric constant in the p-type base layer 31 and the p-type pillar layer 25, the source-drain capacitance increases; and the voltage rise rate (dV/dt) during the switching of the power semiconductor device 15 is reduced to be similar to a snubber capacitance connected externally. As a result, voltage surges can be suppressed in the power semiconductor device 15 during the switching; and noise does not occur easily.

A variation of the fifth embodiment will now be described with reference to FIG. 16. This variation differs from the power semiconductor device 14 of the fifth embodiment in that the insulating film in the n-type pillar layer is a high dielectric constant film. Components similar to those of the first to fifth embodiments and the variations are marked with like reference numerals, and a description thereof is omitted.

Figure 16:
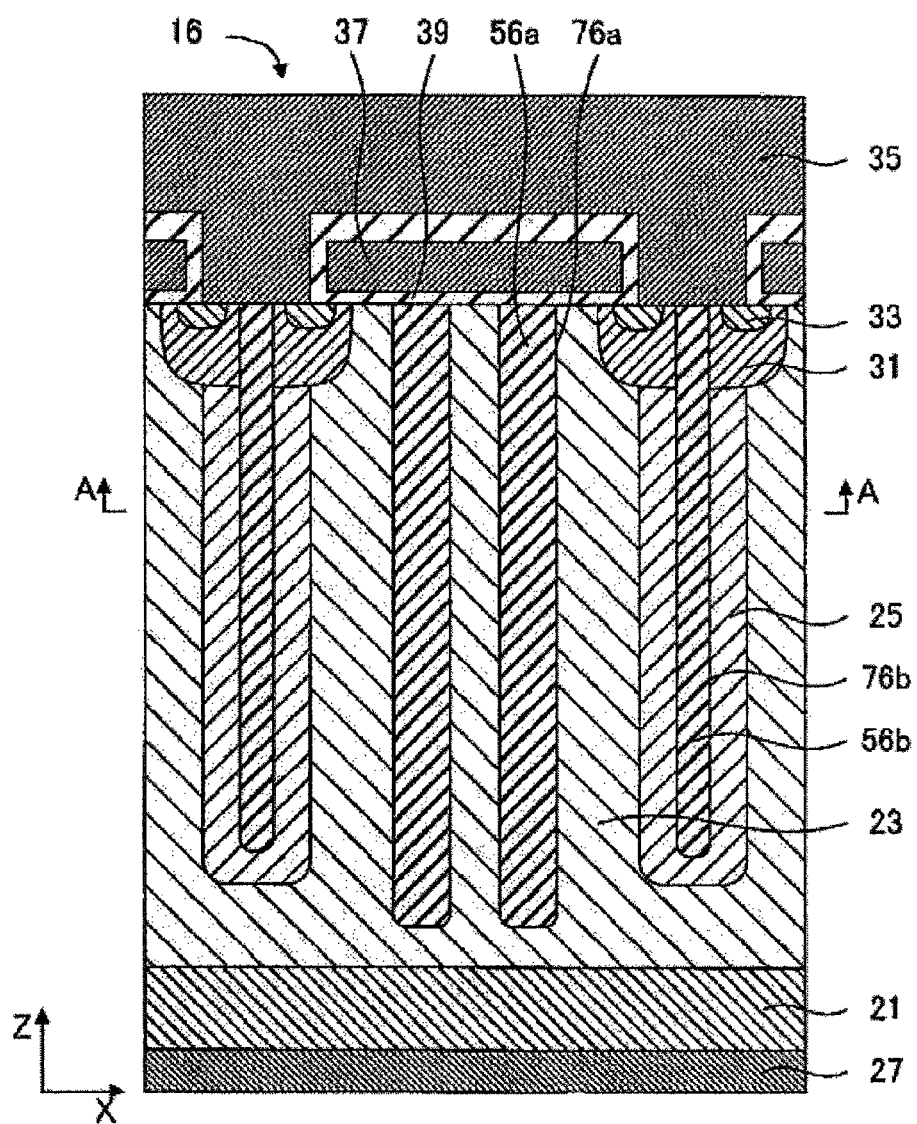
FIG. 16 is a cross-sectional view of the vertical direction schematically illustrating a power semiconductor device according to a variation of the fifth embodiment of the invention.

As illustrated in FIG. 16, the configurations of trenches 76a and 76b of the power semiconductor device 16 are similar to those of the power semiconductor device 15 of the fifth embodiment. A fourth insulating film 56a and a fifth insulating film 56b made of high dielectric constant films are filled into the trench 76a in the n-type pillar layer 23 and the trench 76b in the p-type base layer 31 and the p-type pillar layer 25, respectively. The fourth and fifth insulating films 56a and 56b may be similar to the third insulating film 55b of the power semiconductor device 15. The fourth insulating film 56a and the fifth insulating film 56b may be high dielectric constant films made of mutually different materials.

The power semiconductor device 16 has effects similar to those of the power semiconductor device 15. Further, because the fourth insulating film 56a having a higher relative dielectric constant is arranged in the n-type pillar layer 23 in the power semiconductor device 16, the gate-drain capacitance is increased; and the controllability of dV/dt by the external gate resistance increases. As a result, noise does not occur easily in the power semiconductor device 16.

Sixth Embodiment

A power semiconductor device according to a sixth embodiment of the invention will now be described with reference to FIG. 17. The device differs from the power semiconductor device 1 of the first embodiment in that the n-type pillar layer has a nonuniform impurity concentration distribution. Components similar to those of the first to fifth embodiments and the variations are marked with like reference numerals, and a description thereof is omitted.

Figure 17:
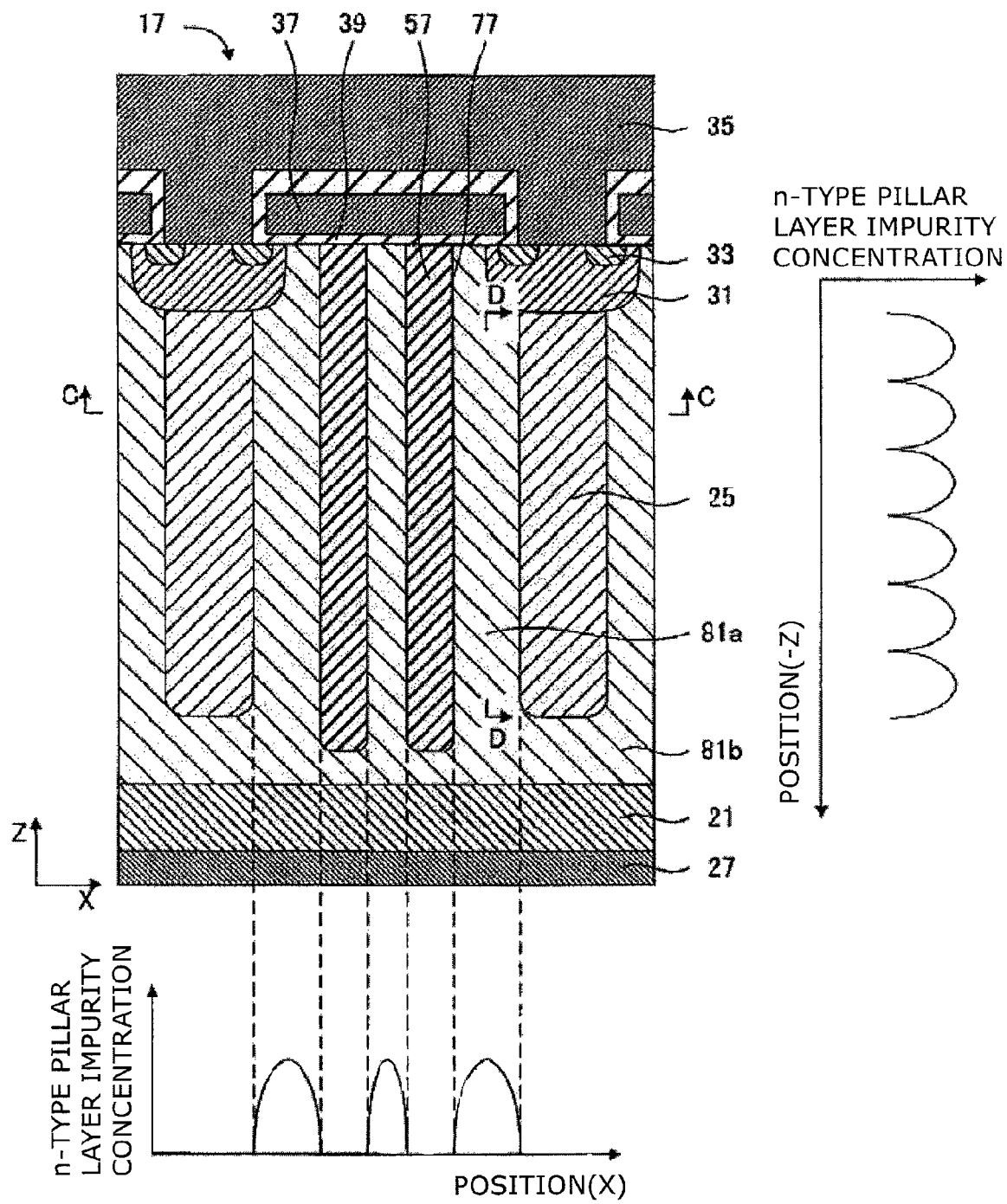
FIG. 17 is a cross-sectional view of the vertical direction schematically illustrating a power semiconductor device according to a sixth embodiment, an impurity concentration distribution along the C-C line in the cross-sectional view is shown at the bottom side, and an impurity concentration distribution along the D-D line in the cross-sectional view is shown at the right side.

In the power semiconductor device 17 as illustrated in FIG. 17, the configurations of a trench 77 and an insulating film 57 formed by filling a silicon oxide film into the trench 77 are the same as those of the insulating film 41 of the power semiconductor device 1 of the first embodiment. N-type pillar layers 81a and 81b are in positions corresponding to the n-type pillar layer 23 of the power semiconductor device 1. The n-type pillar layer 81b between the n$^+$-type drain layer 21 and the bottom face of the p-type pillar layer 25 has a uniform impurity concentration distribution similar to that of the n-type pillar layer 23. On the other hand, the n-type pillar layer 81a which continues upward from the n-type pillar layer 81b and forms the repeating structure with the p-type pillar layer 25 has a distribution in which the impurity concentration along the X-direction is low at boundaries between the n-type pillar layer 81a and the p-type pillar layer 25 and between the n-type pillar layer 81a and the insulating film 57 having the trench configuration and high at the central portion of the n-type pillar layer 81a as illustrated at the bottom side in FIG. 17. As illustrated at the right side in FIG. 17, the impurity concentration of the n-type pillar layer 81a has repeated highs and lows along the Z-direction.

The X-direction impurity concentration profile of the n-type pillar layer 81a can be realized by ion implantation followed by performing embedding epitaxial growth and performing lateral diffusion. The Z-direction impurity concentration profile of the n-type pillar layer 81a can be realized by repeating multiple ion implantations and embedding epitaxial growth.

The power semiconductor device 17 has effects similar to those of the power semiconductor device 1. Further, in the power semiconductor device 17, the impurity amount included in the n-type pillar layer 81a changes little even in the case where the width of the trench 77 changes due to process fluctuation; and the breakdown voltage decrease can be suppressed.

A variation of the sixth embodiment recited above will now be described with reference to FIG. 18. This variation differs from the power semiconductor device 17 of the sixth embodiment in that an insulating film is arranged in the p-type pillar layer, and the p-type pillar layer has a nonuniform impurity concentration distribution. Components similar to the first to sixth embodiments and the variations are marked with like reference numerals, and a description thereof is omitted.

Figure 18:
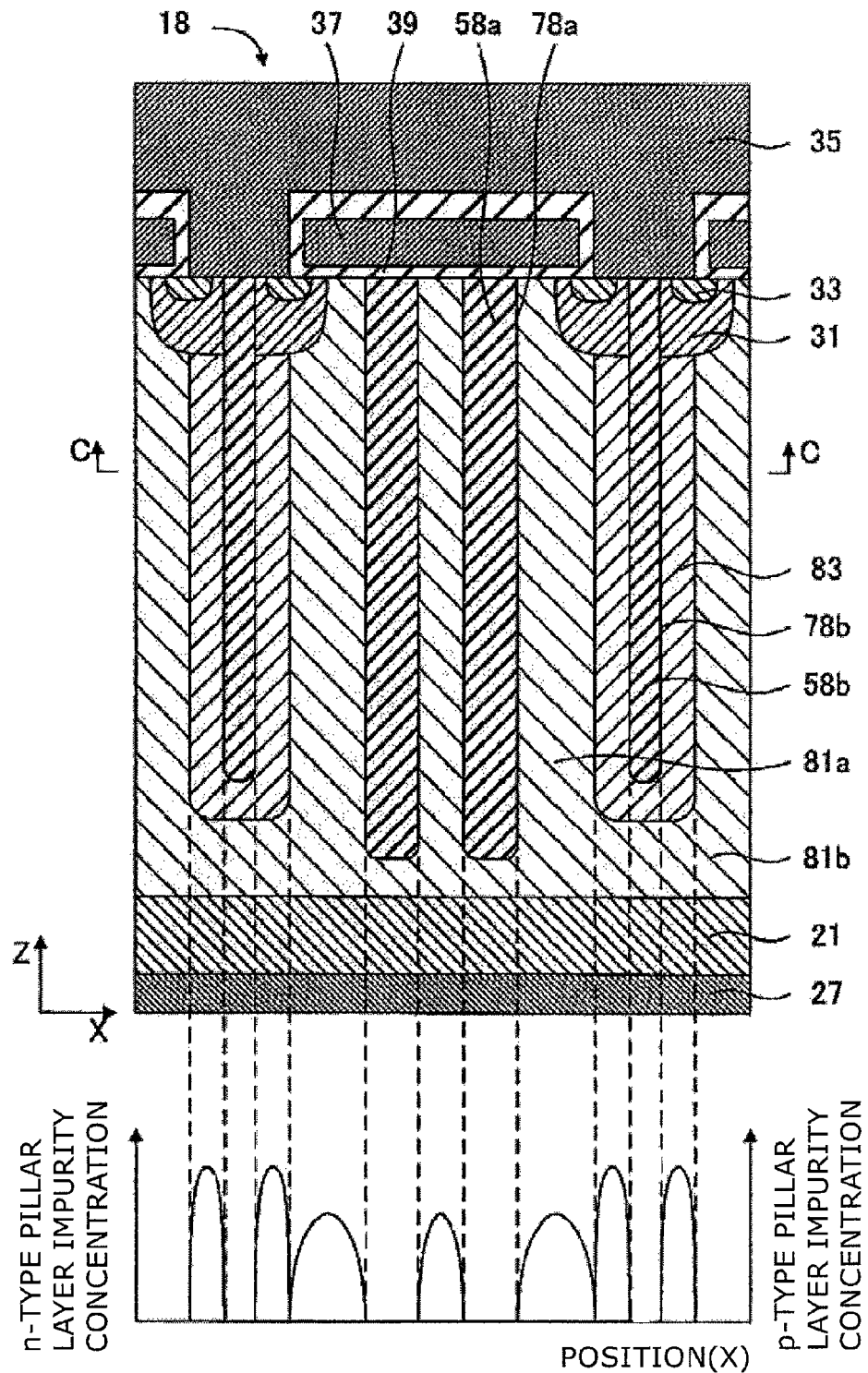
FIG. 18 is a cross-sectional view of the vertical direction schematically illustrating a power semiconductor device according to a variation of the sixth embodiment of the invention and an impurity concentration distribution along the C-C line in the cross-sectional view is shown at the right side.

In the power semiconductor device 18 as illustrated in FIG. 18, in addition to the configuration of the power semiconductor device 17, a p-type pillar layer 83 includes an insulating film 58b (referring to the power semiconductor device 13) in the central portion thereof. The distribution of the impurity concentration of the p-type pillar layer 83 along the X-direction is low at the boundaries between the p-type pillar layer 83 and the n-type pillar layer 81a and between the p-type pillar layer 83 and the insulating film 58b having the trench configuration, and is high at the central portion between the n-type pillar layer 81a and the insulating film 58b as illustrated in FIG. 18B. Insulating films 58a and 58b are formed by filling a silicon oxide film into trenches 78a and 78b.

The power semiconductor device 18 has effects similar to those of the power semiconductor device 17. Further, in the power semiconductor device 18, the change of the impurity amount included in the p-type pillar layer 83 is small even in the case where the width of the trench 78b changes due to the process fluctuation; and the breakdown voltage decrease can be suppressed. In other words, it is possible for the power semiconductor device 18 to have smaller changes of the impurity amounts of the n-type pillar layer 81a and the p-type pillar layer 83 than the power semiconductor device 17.

The invention is not limited to the examples recited above and is practicable with various variations without departing from the purport of the invention.

For example, although the first conductivity type is the n-type and the second conductivity type is the p-type in the description of the exemplary embodiments, the first conductivity type may be the p-type and the second conductivity type may be the n-type.

Although the method of repeating multiple ion implantations and epitaxial growth is described in the exemplary embodiments, the method is not limited thereto. Implementation is possible using various super junction structure formation methods including performing embedding growth after making the trench, performing ion implantation into the side walls after making the trench, etc.

Although a MOSFET using silicon (Si) as the semiconductor is described in the exemplary embodiments, a wide bandgap semiconductor, for example, such as diamond, compound semiconductors such as silicon carbide (SiC) and gallium nitride (GaN), etc., may be used as the semiconductor.

Although a MOSFET having a super junction structure is described in the exemplary embodiments, applications are possible also to devices such as an IGBT (Insulated Gate Bipolar Transistor), a device having a MOSFET combined with an SBD (Schottky Barrier Diode), etc.

Although a planar gate structure is used in the description of the exemplary embodiments, implementation is possible also in a power semiconductor device having a trench gate structure.

Although several patterns of insulating films with trenches having line configurations and planar configurations in the n-type pillar layer illustrated in the first to third embodiments and the variations are applied in the description of the fourth to sixth embodiments and the variations, other examples of patterns of the insulating films with the trenches having line configurations and planar configurations in the n-type pillar layer illustrated in the first to third embodiments and the variations may be applied to the fourth to sixth embodiments and the variations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or variations as would fall within the scope and spirit of the invention.

The invention claimed is:
1. A power semiconductor device, comprising:
a first semiconductor layer of a first conductivity type;
a second semiconductor layer of the first conductivity type and a third semiconductor layer of a second conductivity type provided on the first semiconductor layer of the first conductivity type, the second semiconductor layer disposed alternately with the third semiconductor layer in a first direction on a plane parallel to a surface of the first semiconductor layer;
a first main electrode electrically connected to the first semiconductor layer;

a fourth semiconductor layer of the second conductivity type provided on a surface of the third semiconductor layer;

a fifth semiconductor layer of the first conductivity type selectively provided on a surface of the fourth semiconductor layer;

a second main electrode provided on the surface of the fourth semiconductor layer and a surface of the fifth semiconductor layer;

a control electrode provided via a gate insulating film on the surface of the fourth semiconductor layer, the surface of the fifth semiconductor layer, and a surface of the second semiconductor layer; and a plurality of first insulating films provided in the second semiconductor layer, each first insulating film separated from each other first insulating film by a portion of the second semiconductor layer.

2. The device according to claim 1, wherein the first insulating films do not reach the first semiconductor layer.

3. The device according to claim 1, wherein at least one first insulating film forms a pattern of a broken line configuration or a dot configuration when projected onto a plane.

4. The device according to claim 1, wherein an impurity concentration of the second semiconductor layer changes in the first direction.

5. The device according to claim 4, wherein a distribution of the impurity concentration of the second semiconductor layer increases away from the first insulating films.

6. The device according to claim 1, wherein the third semiconductor layer extends in a second direction orthogonal to the first direction along the surface of the first semiconductor layer, and the plurality of first insulating films include a plurality of portions disposed apart from the third semiconductor layer, disposed apart from each other along the first direction, and extending in the second direction.

7. The device according to claim 6, wherein at least one of the plurality of portions of the first insulating films extending in the second direction is further multiply separated in the second direction.

8. The device according to claim 7, wherein a portion of the plurality of portions of the first insulating films extending in the second direction and not multiply separated in the second direction is adjacent to portions of the plurality of portions of the first insulating films provided on both sides in the first direction, the portions adjacent on both sides in the first direction extending in the second direction and being multiply separated in the second direction.

9. The device according to claim 6, wherein the third semiconductor layer is further separated along the second direction, and the plurality of first insulating layers further includes a plurality of portions extending in the first direction and separated along the second direction between adjacent third semiconductor layers separated in the second direction.

10. The device according to claim 6, further comprising a third insulating film formed to bond to the second main electrode, pierce the fourth semiconductor layer, and be buried in the third semiconductor layer.

11. The device according to claim 10, wherein the third insulating film is a high dielectric constant film made of a material selected from HfOx, ZrOx, and TaOx.

12. The device according to claim 10, wherein an impurity concentration of the second conductivity type of the third semiconductor layer along the first direction has a maximum value between the third insulating film and the second semiconductor layer.

13. The device according to claim 6, wherein an impurity concentration of the first conductivity type of the second semiconductor layer has a maximum value between the plurality of first insulating films and a maximum value between regions of the third semiconductor layer and corresponding adjacent first insulating films.

14. The device according to claim 1, wherein the third semiconductor layer extends in a second direction orthogonal to the first direction, and the plurality of first insulating films includes portions extending in the first direction and multiply separated along the second direction.

15. The device according to claim 1, further comprising a plurality of second insulating films formed along a direction perpendicular to the surface of the first semiconductor layer at a junction surface between the second semiconductor layer and the third semiconductor layer.

16. The device according to claim 1, further comprising a third insulating film formed to bond to the second main electrode and be buried in the fourth semiconductor layer.

17. The device according to claim 1, wherein each of the first insulating films includes a first insulator material having one of a tensile stress and a compressive stress with the second semiconductor layer.

18. The device according to claim 17, further comprising a third insulating film formed to bond to the second main electrode, pierce the fourth semiconductor layer, and be buried in the third semiconductor layer, the third insulating film being made of a second insulator material having a stress with the third semiconductor layer in a direction different from a direction of the stress of the first insulating films with the second semiconductor layer.

19. The device according to claim 17, further comprising a third insulating film formed to bond to the second main electrode and be buried in the fourth semiconductor layer, the third insulating film being made of a second insulator material having a stress with the third semiconductor layer in a direction different from a direction of the stress of the first insulating films with the second semiconductor layer.

20. A power semiconductor device, comprising:

a first semiconductor layer of a first conductivity type;

a second semiconductor layer of the first conductivity type and a third semiconductor layer of a second conductivity type provided on the first semiconductor layer of the first conductivity type, the second semiconductor layer disposed alternately with the third semiconductor layer in a first direction on a plane parallel to a surface of the first semiconductor layer;

a first main electrode electrically connected to the first semiconductor layer:

a fourth semiconductor layer of the second conductivity type provided on a surface of the third semiconductor layer;

a fifth semiconductor layer of the first conductivity type selectively provided on a surface of the fourth semiconductor layer;

a second main electrode provided on the surface of the fourth semiconductor layer and a surface of the fifth semiconductor layer;

a control electrode provided via a gate insulating film on the surface of the fourth semiconductor layer, the surface of the fifth semiconductor layer, and a surface of the second semiconductor layer; and a plurality of first insulating films provided in the second semiconductor layer each first insulating film separated from each other first insulating film by a portion of the second semiconductor layer, wherein the third semiconductor layer extends in a second direction orthogonal to the first direction along the surface of the first semiconductor layer, and the plurality of first insulating films include a plurality of portions disposed apart from the third semiconductor layer, disposed apart from each other along the first direction, and extending in the second direction, and a spacing in the first direction between portions of the plurality of portions of the first insulating films extending in the second direction and adjacent in the first direction is smaller than a spacing in the first direction between the third semiconductor layer and a portion of the plurality of portions of the first insulating films extending in the second direction and adjacent to the third semiconductor layer.

* * * * *